(12) United States Patent
Li et al.

(10) Patent No.: US 12,200,989 B2
(45) Date of Patent: Jan. 14, 2025

(54) DISPLAY SUBSTRATE AND PREPARATION METHOD THEREFOR, AND DISPLAY APPARATUS

(71) Applicants: Hefei BOE Joint Technology Co., Ltd., Anhui (CN); BOE Technology Group Co., Ltd., Beijing (CN)

(72) Inventors: Yongqian Li, Beijing (CN); Zhenhua Qiu, Beijing (CN); Ying Wang, Beijing (CN); Meng Li, Beijing (CN); Dongxu Han, Beijing (CN); Dacheng Zhang, Beijing (CN); Shi Sun, Beijing (CN)

(73) Assignees: Hefei BOE Joint Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 530 days.

(21) Appl. No.: 17/630,171

(22) PCT Filed: Apr. 12, 2021

(86) PCT No.: PCT/CN2021/086685
§ 371 (c)(1),
(2) Date: Jan. 26, 2022

(87) PCT Pub. No.: WO2021/227744
PCT Pub. Date: Nov. 18, 2021

(65) Prior Publication Data
US 2022/0285476 A1   Sep. 8, 2022

(30) Foreign Application Priority Data

May 15, 2020   (CN) .......................... 202010413063.5

(51) Int. Cl.
*H10K 59/131*   (2023.01)
*H10K 50/86*   (2023.01)
(Continued)

(52) U.S. Cl.
CPC ......... *H10K 59/131* (2023.02); *H10K 50/865* (2023.02); *H10K 59/1213* (2023.02);
(Continued)

(58) Field of Classification Search
CPC .............. H10K 59/131; H10K 50/865; H10K 59/1213; H10K 59/1216; H10K 71/00;
(Continued)

(56) References Cited

U.S. PATENT DOCUMENTS

2011/0006975 A1   1/2011   Nagashima et al.
2017/0194390 A1   7/2017   Kim
(Continued)

FOREIGN PATENT DOCUMENTS

CN   107039465 A   8/2017
CN   108461529 A   8/2018
(Continued)

OTHER PUBLICATIONS

International Search Report for PCT/CN2021/086685 Mailed Jul. 16, 2021.

*Primary Examiner* — Kretelia Graham
*Assistant Examiner* — Jaesun Lee
(74) *Attorney, Agent, or Firm* — Ling Wu; Stephen Yang; Ling and Yang Intellectual Property

(57) ABSTRACT

Provided in the present disclosure are a display substrate and a preparation method therefor, and a display apparatus. The display substrate comprises a plurality of display units, each display unit comprising a display area and a transparent area, and the display area comprising a plurality of sub-pixels; each sub-pixel comprises a second metal layer and a third metal layer, the second metal layer comprising a first scanning line and a second scanning line defining a display row, the third metal layer comprising a first power source line, a second power source line, a compensation line, and a data (Continued)

line defining the plurality of sub-pixels; the first power source line, the second power source line, the compensation line, and the data line all comprise a vertical linear section and a horizontal polyline section.

20 Claims, 12 Drawing Sheets

(51) Int. Cl.
  *H10K 59/12* (2023.01)
  *H10K 59/121* (2023.01)
  *H10K 71/00* (2023.01)
(52) U.S. Cl.
  CPC ......... *H10K 59/1216* (2023.02); *H10K 71/00* (2023.02); *H10K 59/1201* (2023.02)
(58) Field of Classification Search
  CPC ........... H10K 59/1201; H10K 59/8792; H10K 59/121
  See application file for complete search history.

(56) References Cited

U.S. PATENT DOCUMENTS

| | | |
|---|---|---|
| 2019/0250450 A1 | 8/2019 | Li |
| 2020/0119120 A1 | 4/2020 | Feng et al. |
| 2020/0312926 A1 | 10/2020 | Bae et al. |
| 2022/0115461 A1 | 4/2022 | Xu et al. |
| 2022/0262886 A1 | 8/2022 | Yuan et al. |
| 2022/0285476 A1 | 9/2022 | Li et al. |

FOREIGN PATENT DOCUMENTS

| | | |
|---|---|---|
| CN | 109448575 A | 3/2019 |
| CN | 110783490 A | 2/2020 |
| CN | 110854296 A | 2/2020 |
| CN | 210607259 U | 5/2020 |
| CN | 111564476 A | 8/2020 |
| CN | 111755480 A | 10/2020 |

DISPLAY SUBSTRATE AND PREPARATION METHOD THEREFOR, AND DISPLAY APPARATUS

CROSS-REFERENCE TO RELATED APPLICATIONS

The present application is a U.S. National Phase Entry of International Application No. PCT/CN2021/086685 having an international filing date of Apr. 12, 2021, which claims priority to Chinese Patent Application No. 202010413063.5 entitled "Display Substrate, Manufacturing Method Thereof, and Display Device" and filed on May 15, 2020. The above-identified applications are incorporated herein by reference in their entireties.

TECHNICAL FIELD

The present disclosure relates to, but is not limited to, the field of display technology, and more particularly, to a display substrate, a manufacturing method thereof, and a display device.

BACKGROUND

An Organic Light Emitting Diode (OLED) is an active light emitting display device, which has the advantages of luminescence, ultra-thinness, wide angle of view, high brightness, high contrast, low power consumption, extremely high response speed, etc. With the continuous development of display technology, OLED technology is increasingly applied in flexible display devices, and has gradually become a next generation display technology with great development prospects. According to different driving modes, OLEDs may be divided into two types, a passive matrix (PM) type and an active matrix (AM) type. An AMOLED is a current driven device which uses an independent thin film transistor (TFT) to control each sub-pixel, each sub-pixel may be continuously and independently driven to emit light.

With the continuous development of display technology, the OLED technology is increasingly applied in transparent display. Transparent display is an important personalized display field of the display technology, refers to display of images in a transparent state, in which a viewer can see not only images in a display device, but also scenes behind the display device, and Virtual Reality (VR) and Augmented Reality (AR) and 3D display functions can be implemented. In a transparent display device using the AMOLED technology, each pixel is generally divided into a display area and a transparent area. The display area provides pixel driving circuits and light emitting elements to implement image display, and the transparent area implements light transmission.

SUMMARY

The following is a summary about the subject matter described herein in detail. The summary is not intended to limit the protection scope of the claims.

There is provided a display substrate including a plurality of display units, wherein each of the display units includes a display area and a transparent area, and the display area includes a plurality of sub-pixels; in a direction perpendicular to the display substrate, each of the sub-pixels includes a first metal layer, a metal oxide layer, a second metal layer and a third metal layer which are disposed on a substrate, the first metal layer includes a first polar plate, the metal oxide layer includes a second polar plate, the second metal layer includes a first scanning line and a second scanning line which extend in a horizontal direction and define a display row, and the third metal layer includes a third polar plate, and a first power line, a second power line, a compensating line and data lines which extend in a vertical direction and define the plurality of sub-pixels; there is an overlapping area between an orthographic projection of the second polar plate on the substrate and an orthographic projection of the first polar plate on the substrate to form a first storage capacitor, there is an overlapping area between an orthographic projection of the third polar plate on the substrate and the orthographic projection of the second polar plate on the substrate to form a second storage capacitor, and the third polar plate is connected to the first polar plate through a via hole; and the first power line, the second power line, the compensating line and the data lines all include vertical straight line segments and horizontal fold line segments, the vertical straight line segments are arranged between the first scanning line and the second scanning line in the display row, and the horizontal fold line segments are arranged between the first scanning lines and the second scanning lines in its adjacent display rows, allowing the display areas in the adjacent display rows staggered, and the transparent areas in the adjacent display rows staggered.

In an exemplary implementation, the display area includes four sub-pixels in which pixel driving circuits are provided, the four sub-pixels including a first sub-pixel, a second sub-pixel, a third sub-pixel and a fourth sub-pixel which are arranged successively, and the pixel driving circuits in the four sub-pixels are arranged in parallel.

In an exemplary implementation, the pixel driving circuit of the first sub-pixel and the pixel driving circuit of the fourth sub-pixel are arranged mirror-symmetrically with respect to the compensating line, and the pixel driving circuit of the second sub-pixel and the pixel driving circuit of the third sub-pixel are arranged mirror-symmetrically with respect to the compensating line.

In an exemplary implementation, the pixel driving circuit includes a first transistor, a second transistor, a third transistor and a storage capacitor, a gate electrode of the first transistor is connected to the first scanning line, a first electrode of the first transistor is connected to the data lines, a second electrode of the first transistor is connected to a gate electrode of the second transistor, a first electrode of the second transistor is connected to the first power line, a second electrode of the second transistor is connected to a first electrode of an organic light emitting diode, a gate electrode of the third transistor is connected to the second scanning line, a first electrode of the third transistor is connected to the compensating line through a compensation connecting line, a second electrode of the third transistor is connected to the second electrode of the second transistor, and a second electrode of the organic light emitting diode is connected to the second power line; the first polar plate and the third polar plate are connected to the second electrode of the second transistor, and the second polar plate is connected to the gate electrode of the second transistor.

In an exemplary implementation, the pixel driving circuit further includes a power connecting line, and the first electrode of the second transistor is connected to the first power line through the power connecting line; the power connecting line is arranged on the same layer as the first scanning line and the second scanning line, and the first power line is connected to the power connecting line through a via hole, to form a double-layer trace between the gate electrode of the first transistor and the gate electrode of the third transistor.

In an exemplary implementation, the pixel driving circuit further includes an auxiliary power line which is arranged on the same layer as the first scanning line and the second scanning line, and the second power line is connected to the auxiliary power line through a via hole, to form a double-layer trace between the gate electrode of the first transistor and the gate electrode of the third transistor.

In an exemplary implementation, the compensation connecting line is arranged on the same layer as the first polar plate, and the second polar plate is arranged on the same layer as an active layer of the first transistor, an active layer of the second transistor and an active layer of the third transistor.

In an exemplary implementation, the organic light emitting diode includes an anode, an organic light emitting layer and a cathode, and the anode is connected to the second electrode of the second transistor of each sub-pixel through a via hole; via holes of the first sub-pixel and the fourth sub-pixel are provided in a gap area between the second polar plate and the active layer of the third transistor, and via holes of the second sub-pixel and the third sub-pixel are provided in an opening area formed in the second polar plate.

In an exemplary implementation, in a direction parallel to the first scanning line, a width of the first power line is greater than a width of the compensating line or data line, and a width of the second power line is greater than a width of the compensating line or data line.

In an exemplary implementation, the first polar plate serves as a shielding layer, a shape of the first polar plate includes a strip-shaped rectangle, and in a direction parallel to the compensating line, a length of the first polar plate is greater than a distance between the gate electrode of the first transistor and the gate electrode of the third transistor.

In an exemplary implementation, each of the horizontal fold line segments at least includes a first vertical line, a first horizontal line and a second vertical line, a first end of the first vertical line is connected to the first power line, the second power line, the compensating line or the data lines in the display row, a first end of the second vertical line is connected to the first power line, the second power line, the compensating line or the data lines in its adjacent display row, and both ends of the first horizontal line are respectively connected to second ends of the first vertical line and the second vertical line.

In an exemplary implementation, an extension direction of the first horizontal line at one side of the display row is the same as the extension direction of the first horizontal line at the other side of the display row, or the extension direction of the first horizontal line at one side of the display row is opposite to the extension direction of the first horizontal line at the other side of the display row.

In an exemplary implementation, the quantities of corners of the horizontal fold line segments of the first power line and the second power line are greater than the quantities of corners of the horizontal fold line segments of the compensating line and the data lines.

In an exemplary implementation, the display areas in odd display rows are aligned, the transparent areas in the odd display rows are aligned, the display areas in even display rows are aligned and the transparent areas in the even display rows are aligned; or the display areas in the odd display rows are aligned with the transparent areas in the even display rows; or the i-th sub-pixels of the display areas in the odd display rows are aligned with the first sub-pixels of the display areas in the even display rows; or the i-th sub-pixels of the display areas in the even display rows are aligned with the first sub-pixels of the display areas in the odd display rows; i=2, 3 or 4.

In an exemplary implementation, the vertical straight line segments of the first power lines in the odd display rows are aligned with the vertical straight line segments of the second power lines in the even display rows; or the vertical straight line segments of the second power lines in the odd display rows are aligned with the vertical straight line segments of the first power lines in the even display rows; or the vertical straight line segments of the first power lines in the odd display rows are aligned with the vertical straight line segments of the compensating lines in the even display rows; or the vertical straight line segments of the second power lines in the odd display rows are aligned with the vertical straight line segments of the compensating lines in the even display rows; or the vertical straight line segments of the first power lines in the odd display rows are aligned with the vertical straight line segments of the data lines in the even display rows; or the vertical straight line segments of the second power lines in the odd display rows are aligned with the vertical straight line segments of the data lines in the even display rows.

In an exemplary implementation, the display substrate further includes a shielding strip, and an orthographic projection of the shielding strip on the substrate contains orthographic projections of the first scanning line, the second scanning line, the first power line and the second power line on the substrate.

There is provided a method for manufacturing a display substrate including a plurality of display units, wherein each of the display units includes a display area and a transparent area, and the display area includes a plurality of sub-pixels; the method includes:

forming a first metal layer, a metal oxide layer and a second metal layer on a substrate, wherein the first metal layer includes a first polar plate; the metal oxide layer includes a second polar plate, and there is an overlapping area between an orthographic projection of the second polar plate on the substrate and an orthographic projection of the first polar plate on the substrate to form a first storage capacitor; the second metal layer includes a first scanning line and a second scanning line which extend in a horizontal direction and define a display row; and forming a third metal layer, wherein the third metal layer includes a third polar plate, and a first power line, a second power line, a compensating line and data lines which extend in a vertical direction and define the plurality of sub-pixels; there is an overlapping area between an orthographic projection of the third polar plate on the substrate and an orthographic projection of the second polar plate on the substrate to form a second storage capacitor, and the third polar plate is connected to the first polar plate through a via hole; the first power line, the second power line, the compensating line and the data lines all include vertical straight line segments and horizontal fold line segments, the vertical straight line segments are arranged between the first scanning line and the second scanning line in the display row, and the horizontal fold line segments are arranged between the first scanning lines and the second scanning lines in its adjacent display rows, allowing the display areas in the adjacent display rows staggered, and the transparent areas in the adjacent display rows staggered.

In an exemplary implementation, forming the first metal layer, the metal oxide layer and the second metal layer on the substrate successively includes:

forming the first metal layer including the first polar plate and a compensation connecting line on the substrate;

forming a first insulating layer overlying the first metal layer, and forming the metal oxide layer including the second polar plate on the first insulating layer; and forming a second insulating layer and the second metal layer disposed on the second insulating layer, wherein pattern of the second insulating layer is the same as pattern of the second metal layer, and the second metal layer includes the first scanning line, the second scanning line and a power connecting line.

In an exemplary implementation, forming the third metal layer includes:

forming a third insulating layer overlying the second metal layer, wherein a plurality of via holes are formed in the third insulating layer, and the plurality of via holes includes a seventh via hole exposing the compensation connecting line, a tenth via hole exposing the first polar plate and an eleventh via hole exposing the power connecting line; and forming the third metal layer on the third insulating layer, wherein the third metal layer includes the third polar plate, the first power line, the second power line, the compensating line, the data lines; there is the overlapping area between the orthographic projection of the third polar plate on the substrate and the orthographic projection of the second polar plate on the substrate to form the second storage capacitor, and the third polar plate is connected to the first polar plate through the tenth via hole; the compensating line is connected to the compensation connecting line through the seventh via hole, and the first power line is connected to the power connecting line through the eleventh via hole.

In an exemplary implementation, the method further includes:

forming a fourth insulating layer and a planarization layer overlying the third metal layer;

forming a light emitting element and an encapsulation layer on the planarization layer, wherein an anode of the light emitting element is connected to the third polar plate, and an cathode of the light emitting element is connected to the second power line; and forming a shielding strip on the encapsulation layer, wherein an orthographic projection of the shielding strip on the substrate contains orthographic projections of the first scanning line, the second scanning line, the first power line and the second power line on the substrate.

There is provided a display device including the display substrate described above.

After the drawings and the detailed description are read and understood, the other aspects may become clear.

BRIEF DESCRIPTION OF DRAWINGS

The drawings are intended to provide a further understanding of technical schemes of the present disclosure and form a part of the specification, and are used to explain the technical schemes of the present disclosure together with the embodiments of the present disclosure, and not intended to form limitations to the technical schemes of the present disclosure. The shapes and sizes of various components in the drawings do not reflect the true proportion, and are only intended to schematically illustrate the contents of the present disclosure.

DESCRIPTION OF REFERENCE NUMBERS

Figure 1:
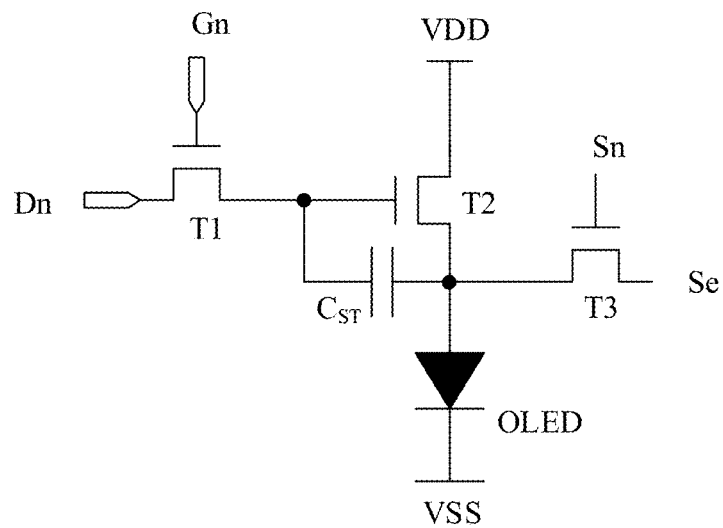
FIG. 1 is an equivalent circuit diagram of a pixel driving circuit in accordance with the present disclosure.

1—display unit;
10—substrate;
11—first active layer;
12—first gate electrode;
13—first source electrode;
14—first drain electrode;
21—second active layer;

22—second gate electrode;
23—third source electrode;
24—second drain electrode;
31—third active layer;
32—third gate electrode;
33—third source electrode;
34—third drain electrode;
41—first polar plate;
51—compensation connecting line
42—second polar plate;
43—third polar plate;
52—power connecting line;
53—auxiliary power line;
61—first insulating layer;
62—second insulating layer;
63—third insulating layer;
64—fourth insulating layer;
65—planarization layer;
70—anode;
71—pixel define layer;
72—organic light emitting layer;
73—cathode;
74—encapsulation layer;
80—shielding strip;
100—display area;
200—transparent area.

DETAILED DESCRIPTION

In order to make the objects, technical schemes and advantages of the present disclosure more clear, the embodiments of the present disclosure will be described in detail below in combination with the drawings. Their implementations may be carried out in many different forms. Those of ordinary skill in the art can easily understand such a fact that manners and contents may be transformed into various forms without departing from the purpose and scope of the present disclosure. Therefore, the present disclosure should not be explained as being limited to the contents recorded in the following implementations only. The embodiments in the present disclosure and features in the embodiments can be arbitrarily combined with each other if there are no conflicts.

Sometimes for clarity, sizes of various constituent elements, thicknesses of layers or areas in the drawings may be exaggerated. Therefore, one implementation of the present disclosure is not necessarily limited to the sizes, and the shapes and sizes of various components in the drawings do not reflect the true proportion. In addition, the drawings schematically illustrate ideal examples, and one implementation of the present disclosure is not limited to the shapes or numerical values shown in the drawings.

Ordinal numerals such as "first", "second", "third" and the like in the specification are set to avoid confusion of the constituent elements, but not to set a limit in quantity.

For convenience, the terms such as "middle", "upper", "lower", "front", "back", "vertical", "horizontal", "top", "bottom", "inside", "outside" and the like indicating orientation or positional relationships are used in the specification to illustrate position relationships between the constituent elements with reference to the drawings, and are intended to facilitate description of the specification and simplify the description, but not to indicate or imply that the mentioned device or element must have a specific orientation or be constructed and operated in a specific orientation, therefore, they should not be understood as limitations to the present disclosure. The position relationships between the constituent elements may be appropriately changed according to directions of various constituent elements described. Therefore, words and phrases used in the specification are not limited and appropriate replacements may be made according to situations.

Unless otherwise specified and defined explicitly, the terms "installed", "coupled" and "connected" should be understood in a broad sense in the specification. For example, the connection may be a fixed connection, a detachable connection or an integrated connection, or may be a mechanical connection or an electrical connection, or may be a direct connection, an indirect connection through intermediate components, or communication inside two components. For those skilled in the art, the specific meanings of the above terms in the present disclosure can be understood according to specific situations.

In the specification, a transistor refers to a component which at least includes three terminals, a gate electrode, a drain electrode and a source electrode. The transistor has a channel region between the drain electrode (drain electrode terminal, drain region, or drain) and the source electrode (source electrode terminal, source region, or source), and a current can flow through the drain electrode, the channel region, and the source electrode. In the specification, the channel region refers to a region which the current flows mainly through.

In the specification, the first electrode may be a drain electrode, and the second electrode may be a source electrode, or the first electrode may be a source electrode, and the second electrode may be a drain electrode. In the case that transistors with opposite polarities are used or that a current direction is changed during circuit operation, functions of "the source electrode" and "the drain electrode" may sometimes be exchanged. Therefore, "the source electrode" and "the drain electrode" may be exchanged in the specification.

In the specification, "electrical connection" includes a case in which the constituent elements are connected together through an element with a certain electric action. "The element with the certain electric action" is not particularly limited as long as electric signals between the connected constituent elements can be sent and received. Examples of "the element with the certain electric action" include not only an electrode and wire, but also a switching element such as a transistor, a resistor, an inductor, a capacitor, other elements with various functions, etc.

In the specification, "parallel" refers to a state in which an angle formed by two straight lines is greater than −10° and less than 10°, and thus also includes a state in which the angle is greater than −5° and less than 5°. In addition, "vertical" refers to a state in which an angle formed by two straight lines is greater than 80° and less than 100°, and thus also includes a state in which the angle is greater than 85° and less than 95°.

In the specification, "film" and "layer" may be interchangeable. For example, sometimes "conducting layer" may be replaced by "conducting film". Similarly, sometimes "insulating film" may be replaced by "insulating layer".

In an exemplary embodiment of the present disclosure, a display substrate includes a plurality of display units, each of the display units includes a display area configured to implement image display and a transparent area configured to implement light transmission, and the display area includes a plurality of sub-pixels; in a direction perpendicular to the display substrate, each of the sub-pixels includes a first metal layer, a metal oxide layer, a second metal layer and a third metal layer which are disposed on a substrate, the first metal layer includes a first polar plate, the metal oxide layer includes a second polar plate, the second metal layer includes a first scanning line and a second scanning line which extend in a horizontal direction and define a display row, and the third metal layer includes a third polar plate, and a first power line, a second power line, a compensating line and data lines which extend in a vertical direction and define the plurality of sub-pixels; there is an overlapping area between an orthographic projection of the second polar plate on the substrate and an orthographic projection of the first polar plate on the substrate to form a first storage capacitor, there is an overlapping area between an orthographic projection of the third polar plate on the substrate and the orthographic projection of the second polar plate on the substrate to form a second storage capacitor, and the third polar plate is connected to the first polar plate through a via hole; and the first power line, the second power line, the compensating line and the data lines all include vertical straight line segments and horizontal fold line segments, the vertical straight line segments are arranged between the first scanning line and the second scanning line in the display row, and the horizontal fold line segments are arranged between the first scanning lines and the second scanning lines in its adjacent display rows, such that the display areas of the adjacent display rows are staggered, and the transparent areas of the adjacent display rows are staggered.

In an exemplary implementation, the display area includes four sub-pixels in which pixel driving circuits are provided, the four sub-pixels including a first sub-pixel, a second sub-pixel, a third sub-pixel and a fourth sub-pixel which are arranged successively, the pixel driving circuits in the four sub-pixels are arranged in parallel, and the pixel driving circuits are configured to be connected to an organic light emitting diode.

In an exemplary implementation, the pixel driving circuit of the first sub-pixel and the pixel driving circuit of the fourth sub-pixel are arranged mirror-symmetrically with respect to the compensating line, and the pixel driving circuit of the second sub-pixel and the pixel driving circuit of the third sub-pixel are arranged mirror-symmetrically with respect to the compensating line.

In an exemplary implementation, the pixel driving circuit includes a first transistor, a second transistor, a third transistor and a storage capacitor, a gate electrode of the first transistor is connected to the first scanning line, a first electrode of the first transistor is connected to the data lines, a second electrode of the first transistor is connected to a gate electrode of the second transistor, a first electrode of the second transistor is connected to the first power line, a second electrode of the second transistor is connected to a first electrode of the organic light emitting diode, a gate electrode of the third transistor is connected to the second scanning line, a first electrode of the third transistor is connected to the compensating line through a compensation connecting line, a second electrode of the third transistor is connected to the second electrode of the second transistor, and a second electrode of the organic light emitting diode is connected to the second power line; the first polar plate and the third polar plate are connected to the second electrode of the second transistor, and the second polar plate is connected to the gate electrode of the second transistor.

In an exemplary implementation, the pixel driving circuit further includes a power connecting line, and the first electrode of the second transistor is connected to the first power line through the power connecting line; the power connecting line is arranged on the same layer as the first scanning line and the second scanning line, and the first power line is connected to the power connecting line through a via hole, to form a double-layer trace between the gate electrode of the first transistor and the gate electrode of the third transistor. The pixel driving circuit further includes an auxiliary power line which is arranged on the same layer as the first scanning line and the second scanning line, and the second power line is connected to the auxiliary power line through a via hole, to form a double-layer trace between the gate electrode of the first transistor and the gate electrode of the third transistor.

In an exemplary implementation, the compensation connecting line is arranged on the same layer as the first polar plate, and the second polar plate is arranged on the same layer as an active layer of the first transistor, an active layer of the second transistor and an active layer of the third transistor.

Diffraction effect means that light bends and scatters with different degrees when passing through an obstacle such as a slit, and thus deviates from the original straight line. In the diffraction effect, the shape of the slit affects the distribution of diffraction fringes. When the length of the slit is longer, positions of the diffraction fringes generated by the slit are the same, such that the obvious diffraction effect will occur. In the existing display transparent substrate, transparent areas in each display column are aligned to form long slits, thus the diffraction effect is obvious, which results in blurring of objects behind the screen, affecting seriously the transparent display effect. In the present disclosure, the transparent areas in the adjacent display rows are staggered to form a mosaic-like transparent area, and when light passes through the mosaic-like transparent area, since positions of the generated diffraction fringes are different and directions of the generated diffraction fringes are different, the diffraction fringes generated by the light will not spread towards one direction but towards multiple directions, thus greatly weakening the diffraction effect, avoiding blurring of the objects behind the screen and improving the transparent display effect.

In an exemplary implementation, the display area includes three or four sub-pixels in which pixel driving circuits are provided, and the pixel driving circuit of each of the sub-pixels is configured to be connected to the organic light emitting diode. FIG. 1 is an equivalent circuit diagram of a pixel driving circuit in accordance with the present disclosure. As shown in FIG. 1, the pixel driving circuit includes a first transistor T1, a second transistor T2, a third transistor T3 and a storage capacitor $C_{ST}$, and a light emitting element is an OLED. The first transistor T1 is a switching transistor, the second transistor T2 is a driving transistor, and the third transistor T3 is a compensation transistor. A gate electrode of the first transistor T1 is connected to a first scanning line Gn, a first electrode of the first transistor T1 is connected to data lines Dn, and a second electrode of the first transistor T1 is connected to a gate electrode of the second transistor T2. The first transistor T1 is used for receiving, under the control of the first scanning line Gn, data signals transmitted by the data lines Dn, so that the gate electrode of the second transistor T2 receives the data signals. The gate electrode of the second transistor T2 is connected to the second electrode of the first transistor T1, a first electrode of the second transistor T2 is connected to a first power line VDD, and a second electrode of the second transistor T2 is connected to a first electrode of the OLED. The second transistor T2 is used for generating, under the control of data signals received by its gate electrode, a corresponding current in its second electrode. A gate electrode of the third transistor T3 is connected to a second scanning line Sn, a first electrode of the third transistor T3 is connected to a compensating line Se, and a second electrode of the third transistor T3 is connected to the second electrode of the second transistor T2. The third transistor T3 is used for extracting a threshold voltage Vth and mobility of the second transistor T2 in response to compensation timing to compensate the threshold voltage Vth. The first electrode of the OLED is connected to the second electrode of the second transistor T2, and a second electrode of the OLED is connected to a second power line VSS. The OLED is used for emitting light of corresponding brightness in response to the current of the second electrode of the second transistor T2. A first electrode of the storage capacitor $C_{ST}$ is connected to the gate electrode of the second transistor T2, and a second electrode of the storage capacitor $C_{ST}$ is connected to the second electrode of the second transistor T2. The storage capacitor $C_{ST}$ is used for storing a potential of the gate electrode of the second transistor T2. In some possible implementations, a voltage of the first power line VDD may be set to be greater than a voltage of the second power line VSS, and the maximum voltage of the data signals transmitted by the data lines Dn is less than the maximum voltage of the first scanning line and is also less than the voltage of the first power line VDD.

Figure 2:
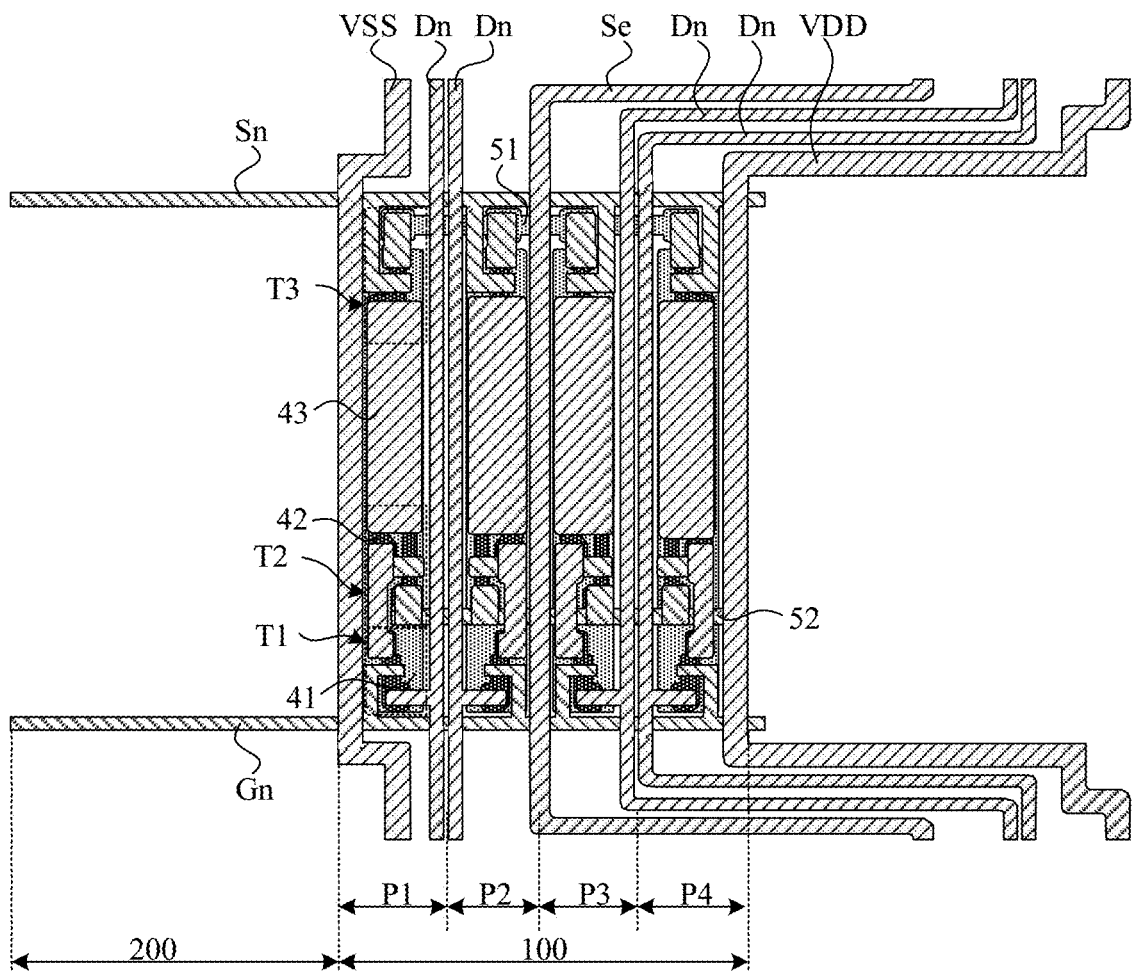
FIG. 2 is a schematic structural diagram of a display substrate in accordance with the present disclosure.

FIG. 2 is a schematic structural diagram of a display substrate in accordance with the present disclosure, which illustrates a structure of a display unit. The display unit includes a display area 100 and a transparent area 200. The display area 100 is configured to implement image display, and the transparent area 200 is configured to implement light transmission, thereby implementing image display in a transparent state, i.e., transparent display. As shown in FIG. 2, the display substrate includes a plurality of first signal lines and second signal lines, and the first signal lines and the second signal lines vertically are intersected to define a plurality of display units. For one display unit, the first signal lines include a first scanning line Gn and a second scanning line Sn extending linearly in the horizontal direction, and the second signal lines include a first power line VDD, a second power line VSS, a compensating line Se and four data lines Dn extending linearly in the vertical direction. In an exemplary implementation, the first scanning line Gn and the second scanning line Sn define one display row which includes one sub-pixel row, the second scanning line Sn is located above the defined sub-pixel row, and the first scanning line Gn is located below the defined sub-pixel row. In the sub-pixel row defined by the first scanning line Gn and the second scanning line Sn (i.e., in an area between the first scanning line Gn and the second scanning line Sn), the second power line VSS of the display unit and the first power line VDD of the display unit define the display area 100 of the display unit, and the second power line VSS of the display unit and the first power line VDD of an adjacent display unit define the transparent area 200 of the display unit. The transparent area 200 is located on the left of the display unit, and the display area 100 is located on the right of the display unit. The display area 100 defined by the first power line VDD and the second power line VSS includes four sub-pixels provided in which pixel driving circuits are provided, so that the first signal lines and the second signal lines define the four sub-pixels in which the pixel driving circuits are provided, the four sub-pixels, in which the pixel driving circuits are provided, being arranged in parallel. The four sub-pixels arranged in the parallel manner are: a first sub-pixel P1, a second sub-pixel P2, a third sub-pixel P3 and a fourth sub-pixel P4. In the following description, the sub-pixels refer to the sub-pixels in which the pixel driving circuits are provided.

In an exemplary implementation, the first sub-pixel P1 is located on the left of the display area and adjacent to the transparent area 200 of the display unit, the fourth sub-pixel P4 is located on the right of the display area and adjacent to the transparent area 200 of another display unit, the second sub-pixel P2 and the third sub-pixel P3 are located between the first sub-pixel P1 and the fourth sub-pixel P4, the second sub-pixel P2 is adjacent to the first sub-pixel P1, and the third sub-pixel P3 is adjacent to the fourth sub-pixel P4.

In an exemplary implementation, in the sub-pixel row defined by the first scanning line Gn and the second scanning line Sn, the first power line VDD, the second power line VSS, the compensating line Se and the four data lines Dn are vertical straight line segments parallel to each other, and between the first scanning line Gn and the second scanning line Sn in the adjacent sub-pixel row, the first power line VDD, the second power line VSS, the compensating line Se and the four data lines Dn are horizontal fold line segments, and the vertical straight line segments and the horizontal fold line segments form fold lines extending in the vertical extension.

In an exemplary implementation, in a direction away from the transparent area 200, the second power line VSS, two data lines Dn, the compensating line Se, two data lines Dn and the first power line VDD are arranged successively. The first sub-pixel is formed between the first power line VDD and the adjacent data lines Dn, the fourth sub-pixel is formed between the second power line VSS and the adjacent data lines Dn, and the second sub-pixel and the third sub-pixel are formed between the compensating line Se and the adjacent data lines Dn. Thus, one compensating line Se and four data lines Dn are arranged between the first power line VDD and the second power line VSS to form four sub-pixels, two of the four data lines Dn are located between the compensating line Se and the second power line VSS, and the other two data lines Dn are located between the compensating line Se and the first power line VDD.

In an exemplary implementation, the display area 100 further includes a plurality of connecting lines, and the plurality of connecting lines at least include a compensation connecting line 51 and a power connecting line 52. The compensation connecting line 51 is connected to the compensating line Se through a via hole, so that the compensating line Se provides compensation signals to the four sub-pixels through the compensation connecting line 51, and the power connecting line 52 is connected to the first power line VDD through a via hole, so that the first power line VDD provides power signals to the four sub-pixels through the power connecting line 52, thereby forming a one-drives-four structure of the first power line VDD and the compensating line Se. In the display substrate in accordance with the present disclosure, the first power line and the compensating line are designed to implement the one-drives-four structure, thereby saving the quantity of signal lines, reducing the space occupied, implementing a simple structure and a reasonable layout, making full use of the layout space, improving the space utilization rate, and being beneficial to improving the resolution and transparency.

As shown in FIG. 2, the pixel driving circuit in each of the four sub-pixels in the display area includes a first transistor T1, a second transistor T2, a third transistor T3 and a storage capacitor. The first transistor T1 includes a first active layer, a first gate electrode, a first source electrode and a first drain electrode, the second transistor T2 includes a second active layer, a second gate electrode, a second source electrode and a second drain electrode, and the third transistor T3 includes a third active layer, a third gate electrode, a third source electrode and a third drain electrode. The storage capacitor includes a first polar plate 41, a second polar plate 42 and a third polar plate 43, the first polar plate 41 and the second polar plate 42 form a first storage capacitor and the second polar plate 42 and the third polar plate 43 form a second storage capacitor. A potential of the first polar plate 41 is the same as a potential of the third polar plate 43, so the first storage capacitor and the second storage capacitor form a parallel structure, thereby effectively improving the storage capacity. The structure of the pixel driving circuit of the first sub-pixel P1 and the structure of the pixel driving circuit of the fourth sub-pixel P4 are mirror symmetric with respect to a vertical axis (the compensating line Se), and the structure of the pixel driving circuit of the second sub-pixel P2 and the structure of the pixel driving circuit of the third sub-pixel P3 are mirror symmetric with respect to the vertical axis (the compensating line Se).

In an exemplary implementation, the first scanning line Gn is connected to the first gate electrode of the first transistor T1 in each sub-pixel, the second scanning line Sn is connected to the third gate electrode of the third transistor T3 in each sub-pixel, the data lines Dn are connected to the first source electrode of the first transistor T1 in each sub-pixel, the compensating line Se is connected to the third source electrode of the third transistor T3 in each sub-pixel through the compensation connecting line 51, and the first power line VDD is connected to the second source electrode of the second transistor T2 in each sub-pixel through the power connecting line 52. Taking the pixel driving circuit in the first sub-pixel P1 as an example, the first gate electrode of the first transistor T1 is connected to the first scanning line Gn, the first source electrode of the first transistor T1 is connected to the data lines Dn, and the first drain electrode of the first transistor T1 is connected to the second gate electrode of the second transistor T2. The second gate electrode of the second transistor T2 is connected to the first drain electrode of the first transistor T1, the second source electrode of the second transistor T2 is connected to the first power line VDD through the power connecting line 52, and the second drain electrode of the second transistor T2 is connected to the third drain electrode of the third transistor T3 and an anode of a light emitting element. The third gate electrode of the third transistor T3 is connected to the second scanning line Sn, the third source electrode of the third transistor T3 is connected to the compensating line Se through the compensation connecting line 51, and the third drain electrode of the third transistor T3 is connected to the second drain electrode of the second transistor T2 and the anode of the light emitting element. The first polar plate 41 is connected to the second drain electrode of the second transistor T2 and the third drain electrode of the third transistor T3 respectively, the second polar plate 42 is connected to the first drain electrode of the first transistor T1 and the second gate electrode of the second transistor T2 respectively, and the third polar plate 43 is connected to the second drain electrode of the second transistor T2 and the third drain electrode of the third transistor T3 respectively. Therefore, the first polar plate 41 and the third polar plate 43 have the same potential, the second polar plate 42 has a different potential from the first polar plate 41 and the third polar plate 43, the first polar plate 41 and the second polar plate 42 form the first storage capacitor, the third polar plate 43 and the second polar plate 42 form the second storage capacitor, and the first storage capacitor and the second storage capacitor form a parallel structure.

In an exemplary implementation, in a direction perpendicular to the display substrate, each sub-pixel includes a first metal layer, a first insulating layer, a metal oxide layer, a second insulating layer, a second metal layer, a third insulating layer, a third metal layer, a fourth insulating layer and a planarization layer which are stacked on a substrate. The first metal layer at least includes the first polar plate 41 and the compensation connecting line 51, the first polar plate 41 also serves as a shielding layer of the display substrate, and the first polar plate 41 and the compensation connecting line 51 are disposed on the same layer and formed by the same patterning process. The metal oxide layer at least includes the second polar plate 42 and the active layers of the three transistors, and the second polar plate 42 and the active layers of the three transistors are arranged on the same layer and formed by the same the patterning process. The second metal layer at least includes the first scanning line Gn, the second scanning line Sn, the power connecting line 52, an auxiliary power line and the gate electrodes of the three transistors, and the first scanning line Gn, the second scanning line Sn, the power connecting line 52, the auxiliary power line and the gate electrodes of the three transistors are arranged on the same layer and formed by the same patterning process. The third metal layer at least includes the data lines Dn, the first power line VDD, the second power line VSS, the third polar plate 43 and the source and drain electrodes of the three transistors, and the data lines Dn, the first power line VDD, the second power line VSS, the third polar plate 43, and the source and drain electrodes of the three transistors are arranged on the same layer and formed by the same patterning process. There is at least an overlapping area between an orthographic projection of the second polar plate 42 on the substrate and an orthographic projection of the first polar plate 41 on the substrate to form the first storage capacitor, and there is at least an overlapping area between the orthographic projection of the third polar plate 43 on the substrate and the orthographic projection of the second polar plate 42 on the substrate to form the second storage capacitor.

A process of manufacturing the display substrate will be exemplarily described below. The "patterning processes" mentioned in the present disclosure include film layer deposition, photoresist coating, mask exposure, development, etching, and photoresist stripping. Deposition may be any one or more of sputtering, evaporation, and chemical vapor deposition. Coating may be any one or more of spray coating and spin coating. Etching may be any one or more of dry etching and wet etching. "Thin film" refers to a layer of thin film formed by a certain material on a substrate using deposition and coating processes. If the "thin film" does not need the patterning processes in the entire manufacturing process, the "thin film" may also be called a "layer". If the "thin film" needs the patterning processes in the entire manufacturing process, the "thin film" is called a "thin film" before the patterning processes and is called a "layer" after the patterning processes. The "layer" processed by the patterning processes includes at least one "pattern". "A and B are disposed on the same layer" in the present disclosure means that A and B are formed simultaneously through the same patterning process.

FIGS. 3-18 are schematic diagrams of a process of manufacturing a display substrate in accordance with the present disclosure, which illustrate a structure of a display unit of the display substrate of a top emission OLED. Each display unit includes a display area 100 and a transparent area 200, the display area 100 includes a first sub-pixel P1, a second sub-pixel P2, a third sub-pixel P3 and a fourth sub-pixel P4, a pixel driving circuit in each sub-pixel includes a first transistor T1, a second transistor T2, a third transistor T3 and a storage capacitor.

Figure 3:
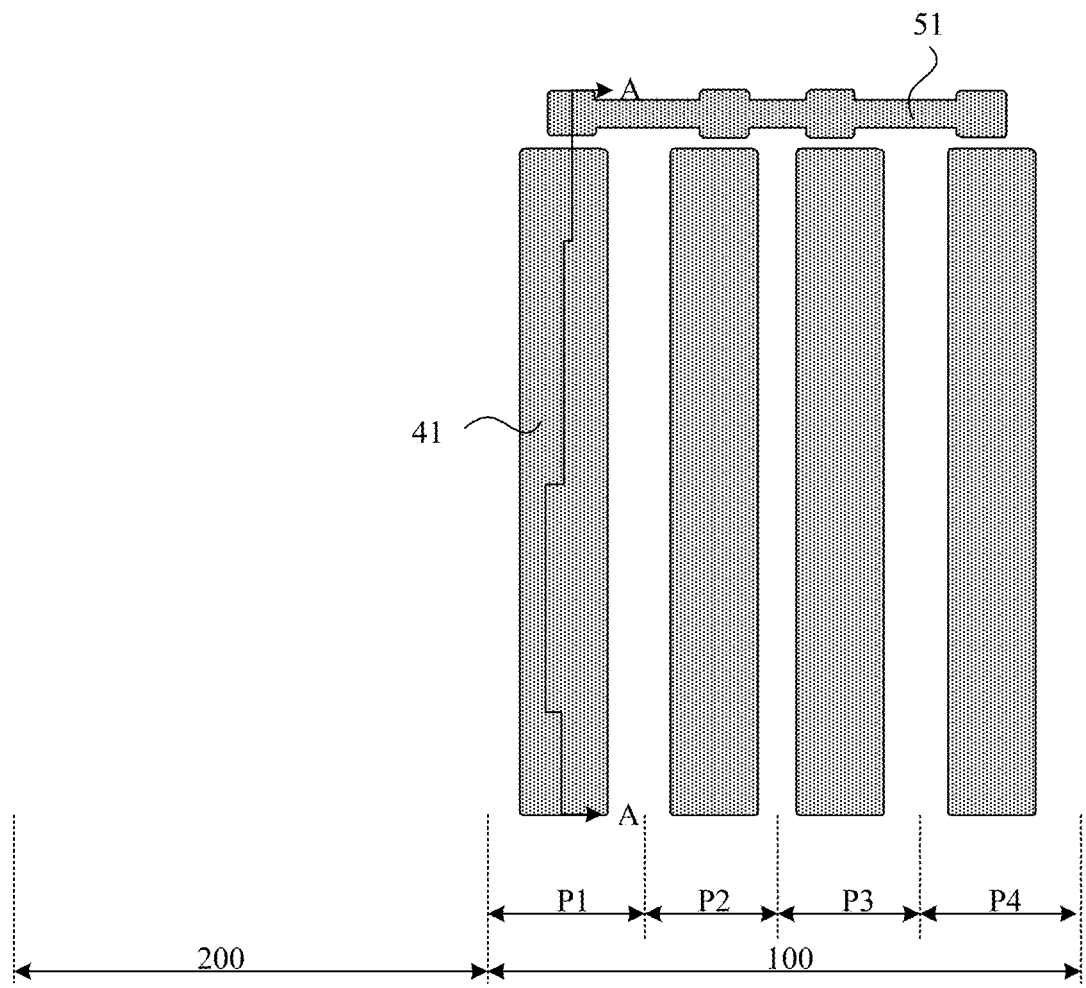
FIG. 3 is a schematic diagram that a pattern of a first metal layer after is formed in accordance with an exemplary embodiment of the present disclosure.
Figure 4:
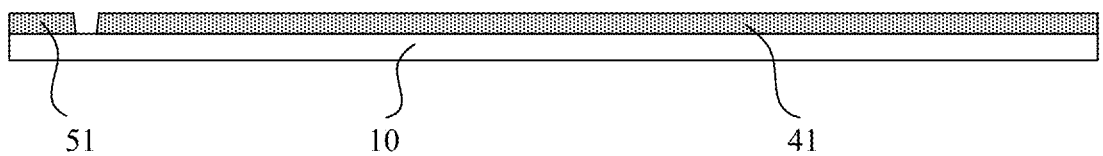
FIG. 4 is a sectional view taken along a direction A-A in FIG. 3.

(1) Pattern of a first metal layer is formed. In an exemplary implementation, forming the pattern of the first metal layer may include: depositing a first metal film on a substrate, patterning the first metal film through a patterning process, and forming the pattern of the first metal layer on the substrate 10. The pattern of the first metal layer include a first polar plate 41 and a compensation connecting lines 51, each sub-pixel forms a first polar plate 41, and the compensation connecting lines 51 is a strip-shaped structure spanning four sub-pixels, as shown in FIGS. 3 and 4. FIG. 4 is a sectional view taken along a direction A-A in FIG. 3. In an exemplary implementation, the first polar plate 41 not only serves as a polar plate of the first storage capacitor and is configured to form the first storage capacitor with the second polar plate formed subsequently, but also serves as a shielding layer and is configured to shield light for the transistors to decrease the intensity of the light irradiated onto the transistors and reduce the leakage current, thereby reducing the influence of light illuminance on the properties of the transistors. The compensation connecting line 51 is configured to be connected to a compensating line formed subsequently, so that the compensating line provides a compensation signal to each sub-pixel. In an exemplary implementation, the first polar plate 41 is a strip-shaped rectangle, and the first polar plate 41 completely overlies the area of the pixel driving circuit in each sub-pixel except the position of the compensation connecting line 51. In order to implement effective shielding, in the direction of the strip, the length of the first polar plate 41 is greater than a distance between a gate electrode of the first transistor and a gate electrode of the third transistor which are formed subsequently. In some possible implementations, the length of the first polar plate 41 is greater than a distance between a first electrode of the first transistor and a first electrode of the third transistor which are formed subsequently. In an exemplary implementation, the pattern of the first metal layer in the first sub-pixel P1 and the pattern of the first metal layer in the fourth sub-pixel P4 are mirror symmetric with respect to a vertical axis, and the pattern of the first metal layer in the second sub-pixel P2 and the pattern of the first metal layer in the third sub-pixel P3 are mirror symmetric with respect to the vertical axis. After this patterning process, the first polar plate 41 and the compensation connecting line 51 are formed in the display area 100, and there is no corresponding film layer in the transparent area 200.

Figure 5:
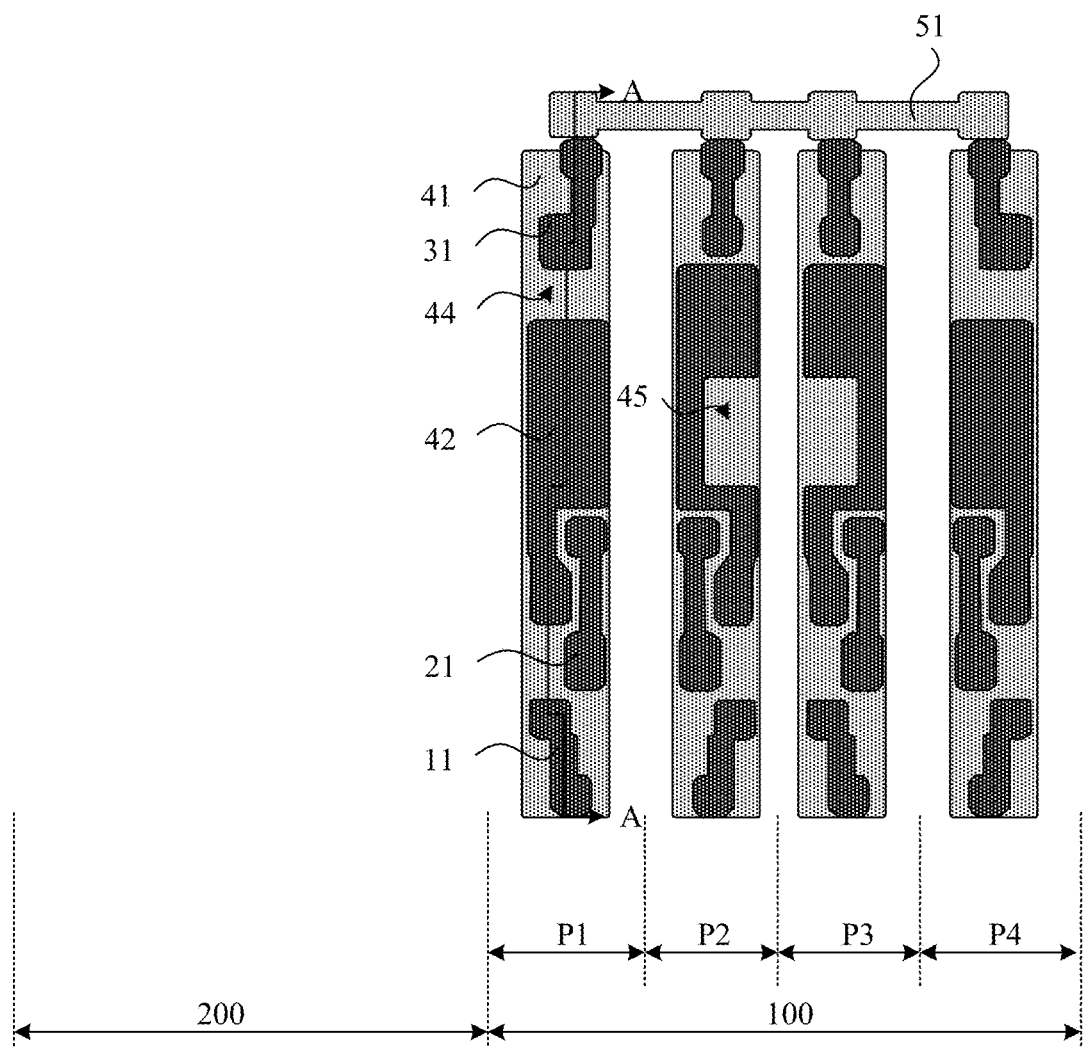
FIG. 5 is a schematic diagram that a pattern of a metal oxide layer is formed in accordance with an exemplary embodiment of the present disclosure.
Figure 6:
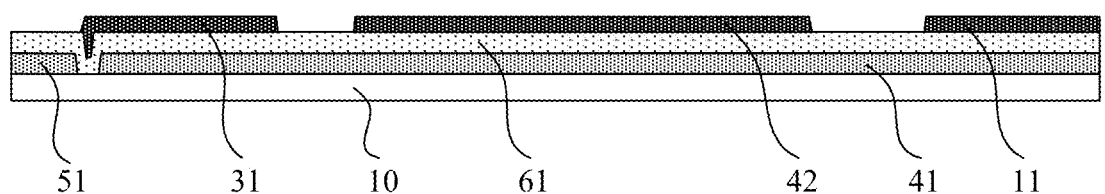
FIG. 6 is a sectional view taken along a direction A-A in FIG. 5.

(2) Pattern of a metal oxide layer is formed. In an exemplary implementation, forming the pattern of the metal oxide layer may include: depositing a first insulating thin film and a metal oxide thin film successively on the substrate, on which the aforementioned patterns are formed, and patterning the metal oxide thin film through the patterning processes to form a first insulating layer 61 overlying the pattern of the first metal layer and the pattern of the metal oxide layer formed on the first insulating layer 61. The metal oxide layer includes patterns of a first active layer 11, a second active layer 21, a third active layer 31 and a second polar plate 42 which are disposed in each sub-pixel, as shown in FIGS. 5 and 6. FIG. 6 is a sectional view taken along a direction A-A in FIG. 5. The first active layer 11 serves as an active layer of the first transistor, the second active layer 21 serves as an active layer of the second transistor, and the third active layer 31 serves as an active layer of the third transistor. There is an overlapping area between an orthographic projection of the second polar plate 42 on the substrate 10 and an orthographic projection of the first polar plate 41 on the substrate 10, and the first polar plate 41 and the second polar plate 42 form a first storage capacitor. The second polar plate 42 serves as not only a polar plate of the first storage capacitor but also a polar plate of the second storage capacitor. The second polar plate is configured to form the second storage capacitor with a third polar plate formed subsequently.

In an exemplary implementation, there is an overlapping area between orthographic projections of the first active layer 11, the second active layer 21 and the third active layer 31 on the substrate 10 and the orthographic projection of the first polar plate 41 on the substrate 10, so that the first polar plate 41 serving as a shielding layer can shield channel regions of the first transistor, the second transistor and the third transistor to prevent the channels from affecting the display effect due to generation of photo-generated leakage current. The orthographic projections of the first active layer 11, the second active layer 21 and the third active layer 31 on the substrate 10 are spaced apart from an orthographic projection of the second polar plate 42 on the substrate 10, that is, there is no overlapping area between the first active layer 11 and the second polar plate 42, between the second active layer 21 and the second polar plate 42 and between the third active layer 31 and the second polar plate 42, which is beneficial to designing width to length ratios of the channels of the first transistor, the second transistor and the third transistor according to relevant requirements. In an exemplary implementation, there is a spacing 44 between the second polar plates 42 in the first sub-pixel P1 and the fourth sub-pixel P4 and the third active layer 31, and an opening 45 is provided in the middle of the second polar plates 42 of the second sub-pixel P2 and the third sub-pixel P3. In an exemplary implementation, the pattern of the metal oxide layer in the first sub-pixel P1 and the pattern of the metal oxide layer in the fourth sub-pixel P4 are mirror symmetric with respect to the vertical axis, and the pattern of the metal oxide layer in the second sub-pixel P2 and the pattern of the metal oxide layer in the third sub-pixel P3 are mirror symmetric with respect to the vertical axis. After this patterning process, the pattern of the metal oxide layer are formed in the display area 100, and the transparent area 200 includes the substrate 10 and the first insulating layer 61 disposed on the substrate 10.

Figure 7:
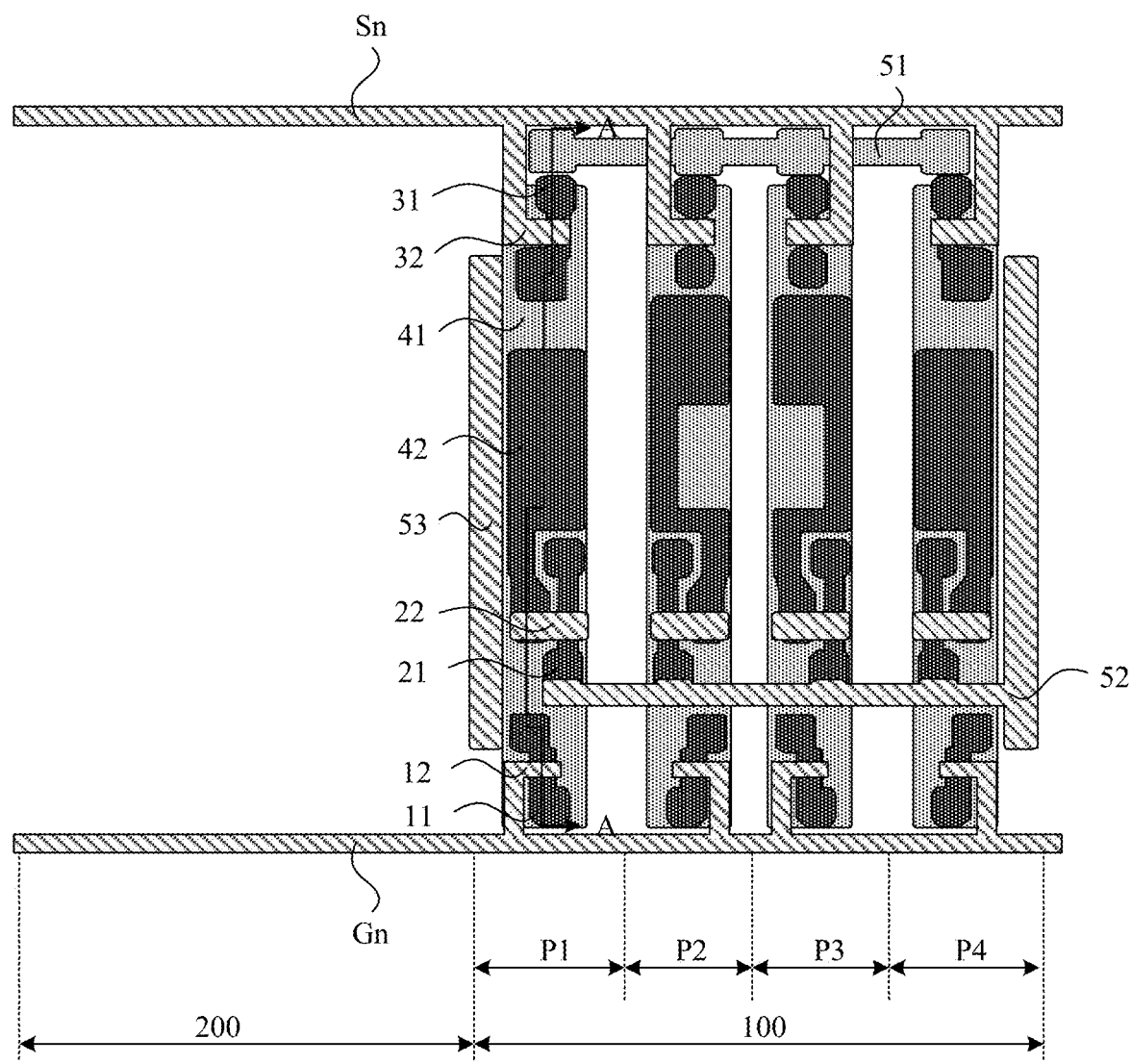
FIG. 7 is a schematic diagram that a pattern of a second metal layer is formed in accordance with an exemplary embodiment of the present disclosure.
Figure 8:
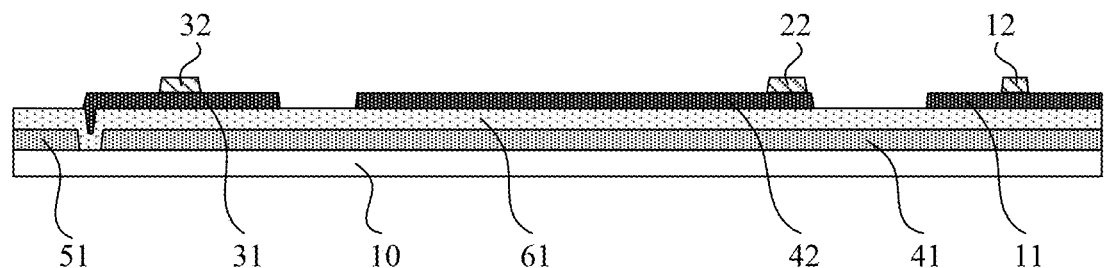
FIG. 8 is a sectional view taken along a direction A-A in FIG. 7.

(3) Pattern of a second metal layer is formed. In an exemplary implementation, forming the pattern of the second metal layer may include: depositing a second insulating thin film and a second metal thin film successively on the substrate, on which the aforementioned patterns are formed, and patterning the second insulating thin film and the second metal thin film through the patterning processes to form pattern of the second insulating layer 62 and the pattern of the second metal layer disposed on the second insulating layer 62. The pattern of the second metal layer include a first scanning line Gn, a second scanning line Sn, a power connecting line 52 and an auxiliary power line 53 formed in each display unit, and a first gate electrode 12, a second gate electrode 22 and a third gate electrode 32 formed in each sub-pixel, as shown in FIGS. 7 and 8. FIG. 8 is a sectional view taken along a direction A-A in FIG. 7. The first scanning line Gn and the second scanning line Sn are arranged in parallel and extend linearly along the horizontal direction. The first scanning line Gn is located above the sub-pixel, and the second scanning line Sn is located below the sub-pixel. The first gate electrode 12 is connected to the first scanning line Gn to form an integrated structure and strides across the first active layer 11, the second gate electrode 22 strides across the second active layer 21 and overlaps with the second polar plate 42, and the third gate electrode 32 is connected to the second scanning line Sn to form an integrated structure and strides across the third active layer 31. The power connecting line 52 includes a first connecting strip perpendicular to the first scanning line Gn and a second connecting strip parallel to the first scanning line Gn. One end of the first connecting strip is connected to one end of the second connecting strip. The first connecting strip is formed in an area where a first power line VDD in the display unit is located, and is configured to be connected to a first power line VDD formed subsequently, and the second connecting strip strides across the four sub-pixels and is configured to provide a high-level signal to each sub-pixel. The auxiliary power line 53 is formed in an area where a second power line VSS in the display unit is located, is perpendicular to the first scanning line Gn, and is configured to be connected to a second power line VSS formed subsequently. In an exemplary implementation, the first connecting strip of the power connecting line 52 and the auxiliary power line 53 are located between the first gate electrode 12 and the third gate electrode 32. In an exemplary implementation, the pattern of the second insulating layer 62 is the same as the pattern of the second metal layer, that is, the second insulating layer 62 is located below the second metal layer, and there is no second insulating layer 62 in an area outside the second metal layer. In an exemplary implementation, the pattern of the second metal layer in the first sub-pixel P1 and the pattern of the second metal layer in the fourth sub-pixel P4 are mirror symmetric with respect to the vertical axis, and the pattern of the second metal layer in the second sub-pixel P2 and the pattern of the second metal layer in the third sub-pixel P3 are mirror symmetric with respect to the vertical axis.

In an exemplary implementation, this process further includes a metallization process. In the metallization process, after the pattern of the second metal layer is formed, plasma treatment is performed using the first gate electrode 12, the second gate electrode 22 and the third gate electrode 32 as a shield, the metal oxide layer in an area shielded by the first gate electrode 12, the second gate electrode 22 and the third gate electrode 32 (i.e., an area where the metal oxide layer is overlapped with the first gate electrode 12, the second gate electrode 22 and the third gate electrode 32) serves as channel regions of the transistors, and the metal oxide layer in an area not shielded by the second metal layer is processed to become a metallization layer, to form the metallized second polar plate 42 and the metallized source and drain regions. After this patterning process, the pattern of the second metal layer are formed in the display area 100, and the transparent area 200 includes the substrate 10 and the first insulating layer 61 disposed on the substrate 10.

Figure 9:
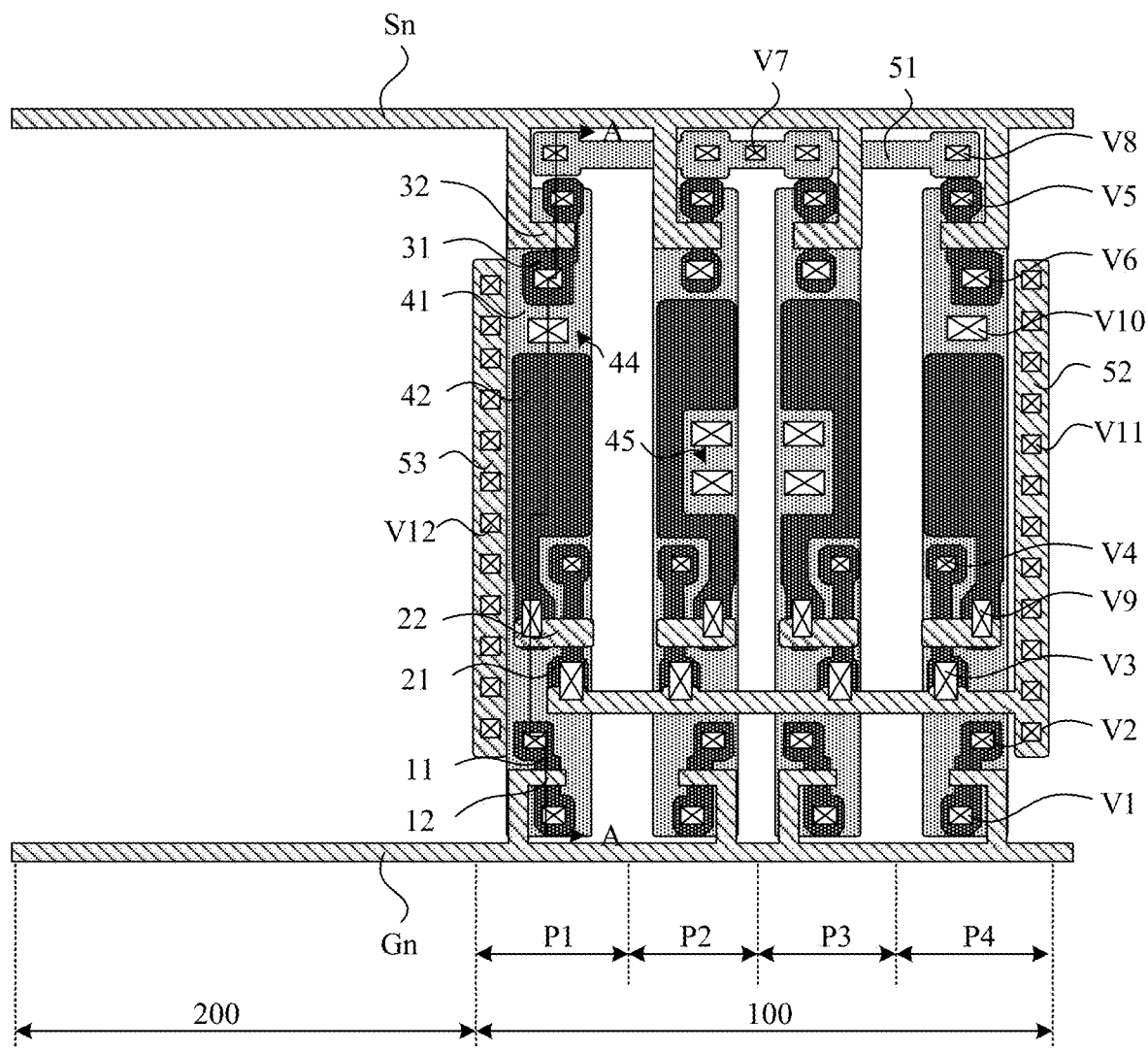
FIG. 9 is a schematic diagram that a pattern of a third insulating layer is formed in accordance with an exemplary embodiment of the present disclosure.
Figure 10:
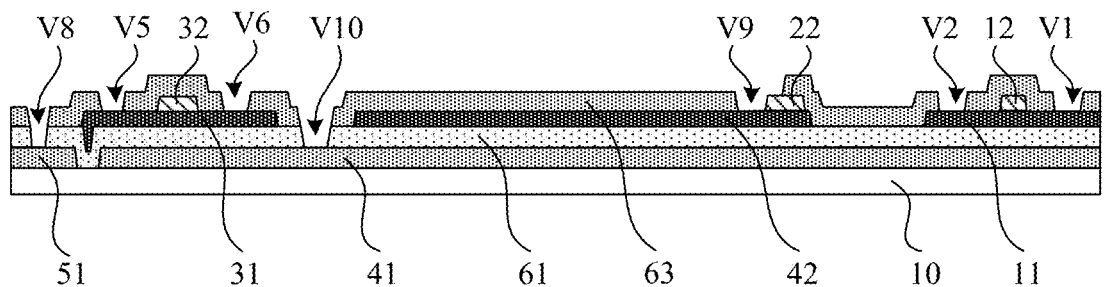
FIG. 10 is a sectional view taken along a direction A-A in FIG. 9.

(4) Pattern of a third insulating layer is formed. In an exemplary implementation, forming the pattern of the third insulating layer may include: depositing a third insulating thin film on the substrate, on which the aforementioned patterns are formed, and patterning the third insulating thin film through the patterning process to form the pattern of the third insulating layer 63 overlying the aforementioned structures. Patterns of a plurality of via holes are provided in the third insulating layer 63, and the patterns of the plurality of via holes includes: a first via hole V1 and a second via hole V2 located at both sides of the first gate electrode 12, a third via hole V3 and a fourth via hole V4 located at both sides of the second gate electrode 22, a fifth via hole V5 and a sixth via hole V6 located at both sides of the third gate electrode 32, a seventh via hole V7 and an eighth via hole V8 located in a position where the compensation connecting line 51 is located, a ninth via hole V9 located in an overlapping area between the second gate electrode 22 and the second polar plate 42, a tenth via hole V10 located in a position where the first polar plate 41 is located, a plurality of eleventh via holes V11 located in a position where the first connecting strip of the power connecting line 52 is located, and a plurality of twelfth via holes V12 located in a position where the auxiliary power line 53 is located, as shown in FIGS. 9 and 10. FIG. 10 is a sectional view taken along a direction A-A in FIG. 9.

The third insulating layer 63 in the first via hole V1 and the second via hole V2 is etched away to expose the surfaces at both ends of the first active layer 11. The third via hole V3 is a transfer via hole formed by two half-holes, one being formed in the second active layer 21 and the other being formed in the second connecting strip of the power connecting line 52. The third insulating layer 63 in the two half-holes is etched away, so that the transfer via hole formed by the two half-holes exposes both the surface of the second active layer 21 and the surface of the second connecting strip of the power connecting line 52, and the third insulating layer 63 in the fourth via hole V4 is etched away to expose the surface of the second active layer 21. The third insulating layer 63 in the fifth via hole V5 and the sixth via hole V6 is etched away to expose the surfaces at both ends of the third active layer 31. The seventh via hole V7 is located a position where the compensation connecting line 51 overlaps with the subsequently formed compensating line. One eighth via hole V8 is formed by each sub-pixel. The first insulating layer 61 and the third insulating layer 63 in the seventh via hole V7 and the eighth via hole V8 are etched away to expose the surface of the compensation connecting line 51. The ninth via hole V9 is a transfer via hole formed by two half-holes, one being formed in the second gate electrode 22 and the other being formed in the second polar plate 42. The third insulating layer 63 in the two half-holes is etched away, so that the transfer via hole formed by the two half-holes exposes both the surface of the second gate electrode 22 and the surface of the second polar plate 42. The tenth via holes V10 in the first sub-pixel P1 and the fourth sub-pixel P4 are located in a position where a gap 44 between the second polar plate 42 and the third active layer 31 is located, the tenth via holes V10 in the second sub-pixel P2 and the third sub-pixel P3 are located in a position where an opening 45 in the middle of the second polar plate 42 is located, and the first insulating layer 61 and the third insulating layer 63 in the tenth via holes V10 are etched away to expose the surface of the first polar plate 41. The eleventh via hole V11 is located in a position where the first connecting strip of the power connecting line 52 is located, a plurality of eleventh via holes V11 are arranged at intervals, and the third insulating layer 63 in the eleventh via holes V11 is etched away to exposing the surface of the first connecting strip of the power connecting line 52. The twelfth via hole V12 is located in a position where the auxiliary power line 53 is located, a plurality of twelfth via holes V12 are arranged at intervals, and the third insulating layer 63 in the twelfth via holes V12 is etched away to expose the surface of the auxiliary power line 53. After this patterning processes, the patterns of the plurality of via holes are formed in the display area 100, and the transparent area 200 includes the first insulating layer 61 and the third insulating layer 63 stacked on the substrate 10.

Figure 11:
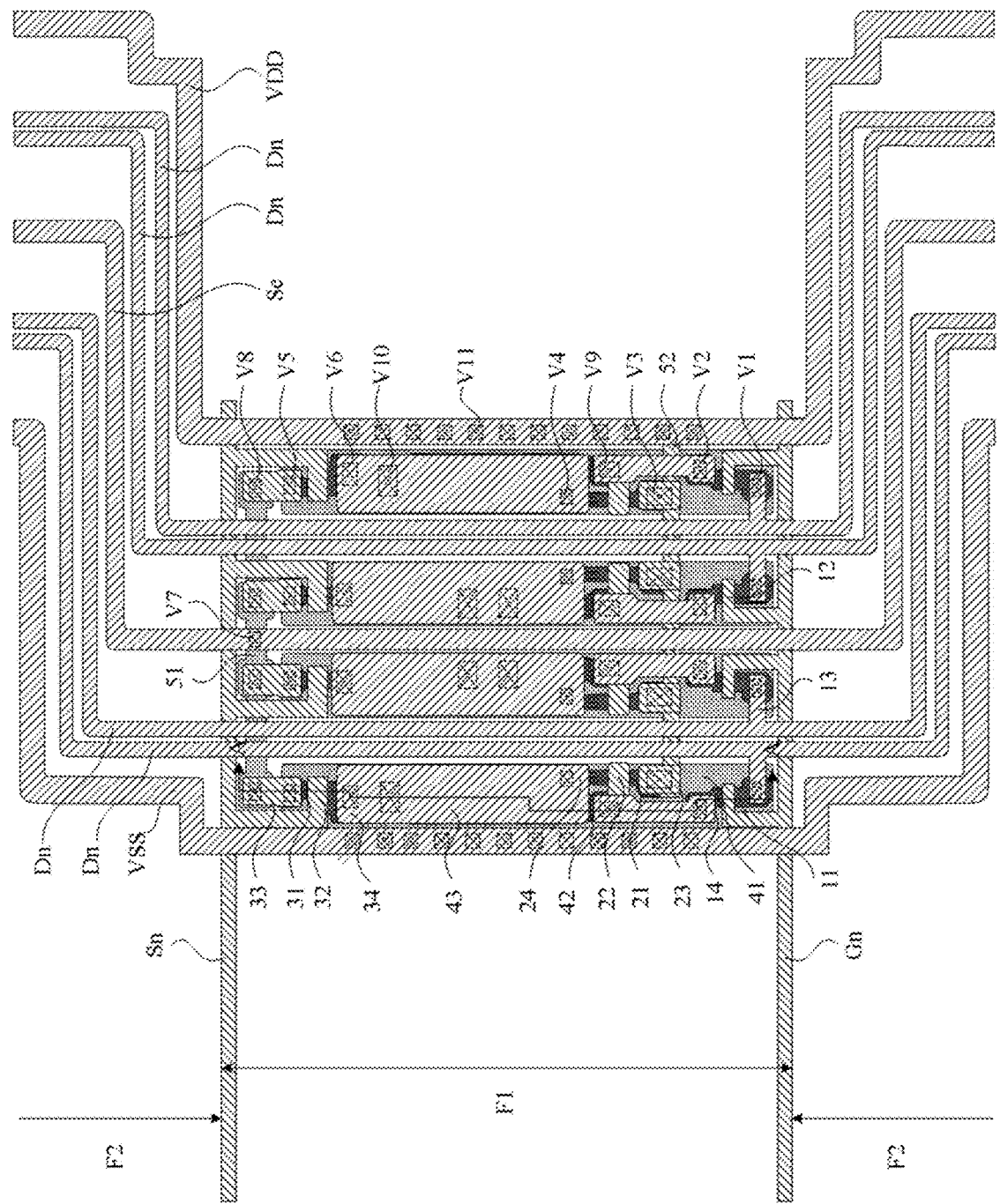
FIG. 11 is a schematic diagram that a pattern of a third metal layer is formed in accordance with an exemplary embodiment of the present disclosure.
Figure 12:
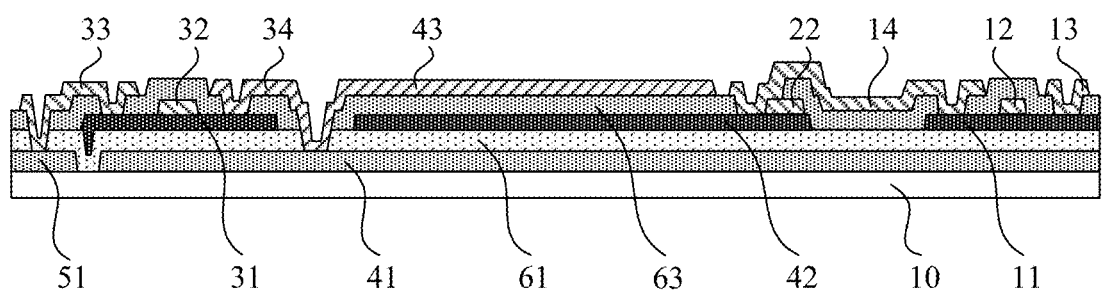
FIG. 12 is a sectional view taken along a direction A-A in FIG. 11.

(5) Pattern of a third metal layer is formed. In an exemplary implementation, forming the pattern of the third metal layer may include: depositing a third metal thin film on the substrate, on which the aforementioned patterns are formed, and patterning the third metal thin film through the patterning process to form the pattern of the third metal layer on the third insulating layer 63. The third metal layer includes: a first power line VDD, a second power line VSS, a compensating line Se and four data lines Dn formed in each display unit, and patterns of a first source electrode 13, a first drain electrode 14, a second source electrode 23, a second drain electrode 24, a third source electrode 33, a third drain electrode 34 and a third polar plate 43 formed in each sub-pixel. Within a range F1 of sub-pixel rows defined by the first scanning line Gn and the second scanning line Sn, the first power line VDD, the second power line VSS, the compensating line Se and the four data lines Dn are vertical straight line segments parallel to each other, while within the range F2 between adjacent sub-pixel rows, the first power line VDD, the second power line VSS, the compensating line Se and the four data lines Dn are horizontal fold line segments, as shown in FIGS. 11 and 12. FIG. 12 is a sectional view taken along a direction A-A in FIG. 11.

In an exemplary implementation, within the range F1 of sub-pixel rows, the first power line VDD, the second power line VSS, the compensating line Se and the four data lines Dn are vertical straight line segments parallel to each other, the second power line VSS, two of the data lines Dn, the compensating line Se, the other two of the data lines Dn and the first power line VDD are arranged successively along a direction away from the transparent area 200, the second power line VSS is arranged at a side close to the transparent area 200, the first power line VDD is arranged at the side away from the transparent area 200, the compensating line Se is arranged between the first power line VDD and the second power line VSS, two of the data lines Dn are arranged between the second power line VSS and the compensating line Se, and the other two of the data lines Dn are arranged between the first power line VDD and the compensating line Se. The first sub-pixel P1 is formed between the first power line VDD and the adjacent data lines Dn, the fourth sub-pixel P4 is formed between the second power line VSS and the adjacent data lines Dn, and the second sub-pixel P2 and the third sub-pixel P3 are formed between the compensating line Se and the adjacent data lines Dn, respectively. Thus, one compensating line Se and four data lines Dn are arranged between the first power line VDD and the second power line VSS to form four sub-pixels, two of the four data lines Dn are located between the compensating line Se and the second power line VSS, and the other two of the data lines Dn are located between the compensating line Se and the first power line VDD.

In an exemplary implementation, the first power line VDD is connected to the power connecting line 52 through a plurality of eleventh via holes V11, so that the first power line VDD is connected to the second source electrode 23 of each sub-pixel through the power connecting line 52 to form a double-layer trace between the first gate electrode 12 and the third gate electrode 32, thereby ensuring the reliability of transmission of power signals and decreasing the resistance of the first power line VDD. The double-layer trace includes the power connecting line 52 of the second metal layer and the first power line VDD of the third metal layer. The second power line VSS is connected to the auxiliary power line 53 through a plurality of twelfth via holes V12, to form a double-layer trace between the first gate electrode 12 and the third gate electrode 32, thereby ensuring the reliability of transmission of power signals and decreasing the resistance of the second power line VSS. The double-layer trace includes the auxiliary power line 53 of the second metal layer and the second power line VSS of the third metal layer. In some possible implementations, in a direction parallel to the first scanning line Gn and the second scanning line Sn, the widths of the first power line VDD and the second power line VSS are both greater than the width of the compensating line Se, and the widths of the first power line VDD and the second power line VSS are both greater than the width of the data line Dn, such that the resistances of the first power line VDD and the second power line VSS can be further decreased. The compensating line Se is connected to the compensation connecting line 51 through the seventh via hole V7, so that the compensating line Se is respectively connected to the third source electrode 33 of each sub-pixel through the compensation connecting line 51. The compensating line Se is arranged in the middle of the display area 100 and is connected to the third transistors of the sub-pixels at both sides of the display area, and the third transistors of the sub-pixels at both sides of the display area are arranged mirror-symmetrically with respect to the compensating line Se. With such a symmetrical design, each display unit need only one compensating line Se to ensure that compensation signals have the substantially same RC delay before written into the transistors, there ensuring uniformity of display.

In an exemplary implementation, the first source electrode 13 is connected to the data lines Dn to form an integrated structure, the first source electrode 13 is connected to one end of the first active layer 11 through the first via hole V1, the first drain electrode 14 is connected to the other end of the first active layer 11 through the second via hole V2, and the first drain electrode 14 is connected to both the second gate electrode 22 and the second polar plate 42 through the ninth via hole V9 with a transfer structure, such that the first drain electrode 14, the second gate electrode 22 and the second polar plate 42 have the same potential. The second source electrode 23 is connected to both the power connecting line 52 and one end of the second active layer 21 through the third via hole V3 with a transfer structure, such that the second source electrode 23 is connected to the first power line VDD, and the second drain electrode 24 is connected to the other end of the second active layer 21 through the fourth via hole V2. The third source electrode 33 is connected to one end of the third active layer 31 through the fifth via hole V5 and also connected to the compensation connecting line 51 through the eighth via hole V8, such that the third source electrode 33 is connected to the compensating line Se, and the third drain electrode 34 is connected to the other end of the third active layer 31 through the sixth via hole V6. The second drain electrode 24, the third drain electrode 34 and the third polar plate 43 are connected to each other to form an integrated structure, and the third polar plate 43 is connected to the first polar plate 41 through the tenth via hole V10. Therefore, the second drain electrode 24 is connected to both the first polar plate 41 and the third polar plate 43, and the third drain electrode 34 is connected to both the first polar plate 41 and the third polar plate 43, such that the second drain electrode 24, the third drain electrode 34, the first polar plate 41 and the third polar plate 43 to have the same potential. There is an overlapping area between an orthographic projection of the third polar plate 43 on the substrate 10 and the orthographic projection of the second polar plate 42 on the substrate 10, and the third polar plate 43 and the second polar plate 42 form the second storage capacitor. In an exemplary implementation, the pattern of the third metal layer in the first sub-pixel P1 and the pattern of the third metal layer in the fourth sub-pixel P4 are mirror symmetric with respect to the vertical axis, and the pattern of the third metal layer in the second sub-pixel P2 and the pattern of the third metal layer in the third sub-pixel P3 are mirror symmetric with respect to the vertical axis.

In an exemplary implementation, in the range F2 between the adjacent sub-pixel rows, that is, in an area between the second scanning line Sn in the sub-pixel row and the first scanning line Gn in the adjacent sub-pixel row and an area between the first scanning line Gn in the sub-pixel row and the second scanning line Sn in the adjacent sub-pixel row, the first power line VDD, the second power line VSS, the compensating line Se and the four data lines Dn are all horizontal fold line segments, and a plurality of horizontal fold line segments are correspondingly connected to a plurality of vertical straight line segments in the sub-pixel row.

Figure 13:
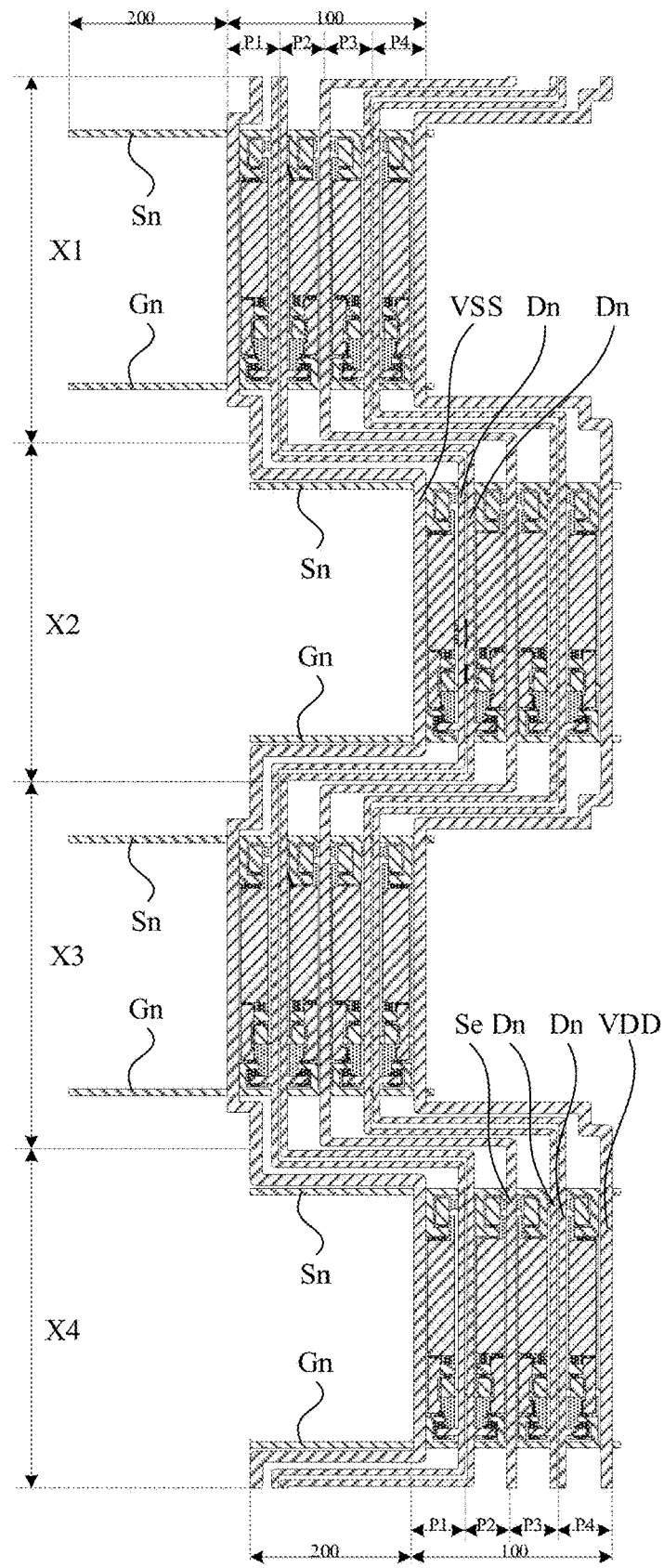
FIG. 13 is a schematic structural diagram of a display column of a display substrate in accordance with an exemplary embodiment of the present disclosure.

FIG. 13 is a schematic structural diagram of a display column of a display substrate in accordance with an exemplary embodiment of the present disclosure, which illustrates a structure of four display units in the display column. In an exemplary implementation, relative positions of a display area 100 and a transparent area 200 in each of the display units are the same, the display area 100 is located on the left of the transparent area 200, structures of sub-pixels in the display area 100 are the same, a first sub-pixels P1, a second sub-pixels P2, a third sub-pixels P3 and a fourth sub-pixel P4 are arranged successively along a direction away from the transparent area 200, and a second power line VSS, two data lines Dn, a compensating line Se, two data lines Dn, and a first power line VDD in vertical straight line segments are arranged successively. As shown in FIG. 13, in one display column, the display areas 100 in odd display rows are aligned, the transparent areas 200 in the odd display rows are aligned, the display areas 100 in even display rows are aligned, and the transparent areas 200 in the even display rows are aligned, but the display areas 100 in the odd display rows are shifted in the horizontal direction relative to the display areas 100 in the even display rows, and the transparent areas 200 in the odd-numbered display rows are shifted in the horizontal direction relative to the transparent areas 200 in even-numbered display rows, so that the display areas 100 in the odd-numbered display rows and the display areas 100 in the even display rows are staggered, and the transparent areas 200 in odd display rows and the transparent areas 200 in even display rows are staggered, to form a mosaic-like transparent area. In an exemplary implementation, the display units X1 and X3 are display units in the odd display rows, the display units X2 and X4 are display units in the even display rows, and the display areas 100 in the even display rows are shifted to the right relative to the display areas 100 in the odd display rows, so horizontal fold line segments outside the display areas of the display units in the odd display rows are fold lines that bend and extend to the right, and horizontal fold line segments outside the display areas of the display units in the even display rows are fold lines that bend and extend to the left, such that the horizontal fold line segments cause the staggered vertical straight line segments in the adjacent display rows to be connected correspondingly. In some possible implementations, the display areas in the even display rows can be set to be shifted to the left relative to the display areas in the odd display rows.

In some possible implementations, a horizontal fold line segment arranged between the first scanning line Gn of the display unit X1 and the second scanning line Sn of the display unit X2 includes at least a first vertical line, a first horizontal line and a second vertical line, a first end of the first vertical line is connected to a second signal line of the display unit X1, a first end of the second vertical line is connected to a second signal line of the display unit X2, and the first horizontal line is connected to second ends of the first vertical line and the second vertical line respectively. Thus, the first vertical line, the first horizontal line and the second vertical line connected in sequence implement a connection between the second signal line of the display unit X1 and the second signal line of the display unit X2.

In some possible implementations, the data lines Dn and the compensating line Se include a first vertical line, a first horizontal line and a second vertical line to form a horizontal fold line segment with two corners. The first power line VDD and the second power line VSS include a first vertical line, a first horizontal line, a second vertical line, a second horizontal line and a third vertical line to form a horizontal fold line segment with four corners. The quantity of corners of horizontal fold lines in the first power line VDD and the second power line VSS is set to be greater than the quantity of corners of horizontal fold lines in the data lines Dn and the compensating line Se, such that the area of the transparent area can be effectively increased and the transparent display effect can be improved.

In some possible implementations, a shape of a connecting line can be adjusted according to a space between the adjacent display units. For example, the first vertical line and the second vertical line may be parallel to the compensating line Se, or may have a set included angle with the compensating line Se. As another example, the first horizontal line may be parallel to the first scanning line Gn, or may have a set included angle with the first scanning line Gn. As a further example, the horizontal fold line segments outside the display areas of the display units in a display row all extend in the same direction, or the horizontal fold lines above the display areas extend in the first direction, and the horizontal fold lines below the display areas extend in the second direction, which is opposite to the first direction. As another example, the first vertical line, the first horizontal line and the second vertical line can be arc lines, which is not specifically limited herein in the present disclosure.

In some possible implementations, the display areas 100 in the odd display rows can be set to be aligned with the transparent areas 200 in the even display rows, or the i-th sub-pixels of the display areas 100 in the odd display rows can be set to be aligned with the first sub-pixels of the display areas 100 in the even display rows, or the i-th sub-pixels of the display areas 100 in the even display rows can be set to be aligned with the first sub-pixels of the display areas 100 in the odd display rows, i=2, 3 or 4.

In some possible implementations, the vertical straight line segments of the first power lines VDD in the odd display rows can be set to be aligned with the vertical straight line segments of the second power lines VSS in the even display rows, or the vertical straight line segments of the second power lines VSS in the odd display rows can be set to be aligned with the vertical straight line segments of the first power lines VDD in the even display rows, or the vertical straight line segments of the first power lines VDD in the odd display rows can be set to be aligned with the vertical straight line segments of the compensating lines Se in the even display rows, or the vertical straight line segments of the second power lines VSS in the odd display rows can be set to be aligned with the vertical straight line segments of the compensating lines Se in the even display rows, or the vertical straight line segments of the first power lines VDD in the odd display rows can be set to be aligned with the vertical straight line segments of the data lines Dn in the even display rows, or the vertical straight line segments of the second power lines VSS in the odd display rows can be set to be aligned with the vertical straight line segments of the data lines Dn in the even display rows, which is not specifically limited herein in the present disclosure.

In an exemplary implementation, a mosaic-like transparent area is configured to decrease the diffraction effect of the transparent area, and when light passes through the mosaic-like transparent area, since positions generating diffraction fringes are different and directions of the generated diffraction fringes are different, the diffraction fringes generated by the light will not spread towards one direction but towards multiple directions, thus greatly weakening the diffraction effect, avoiding blurring of the objects behind the screen and improving the transparent display effect. After this patterning process, the transparent area 200 includes the first insulating layer 61 and the third insulating layer 63 stacked on the substrate 10.

Figure 14:
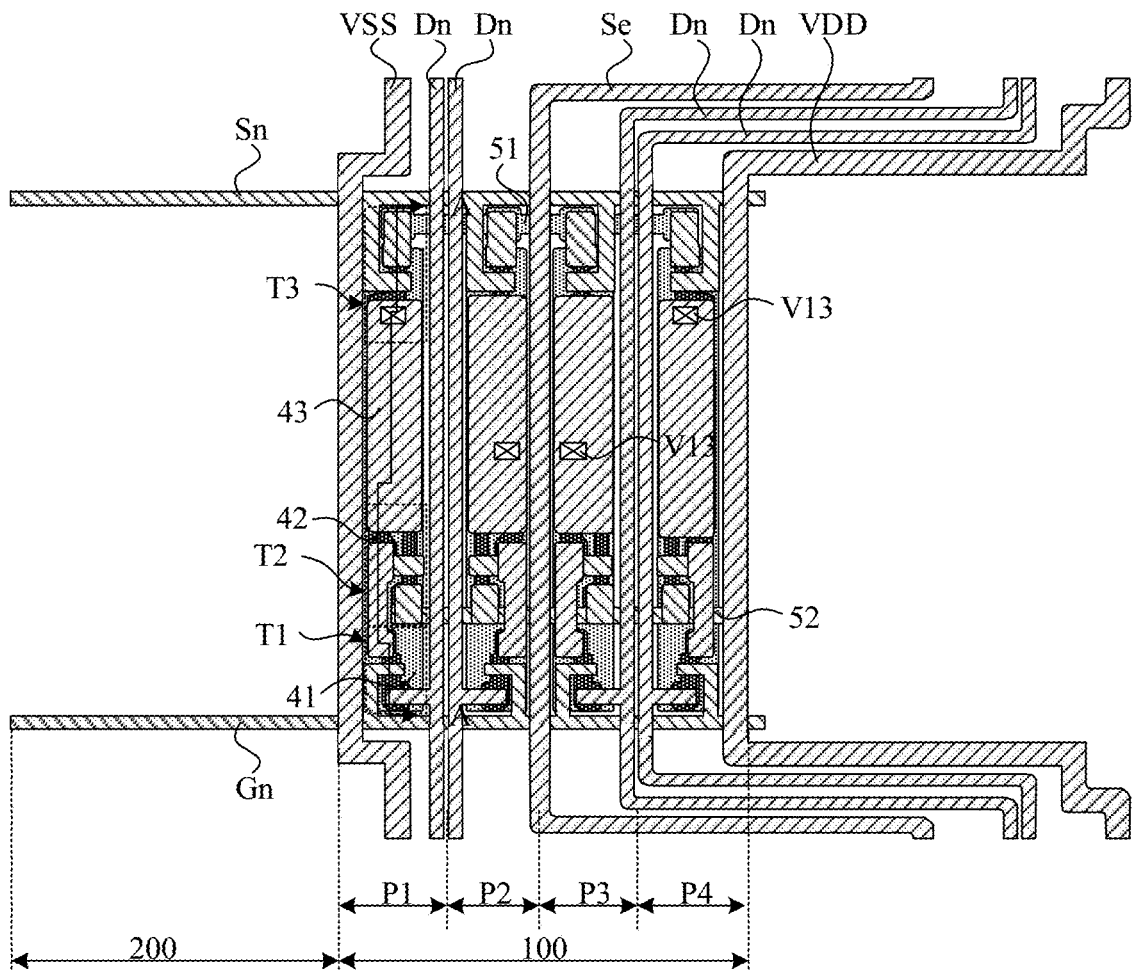
FIG. 14 is a schematic diagram that patterns of a fourth insulating layer and a planarization layer are formed in accordance with an exemplary embodiment of the present disclosure.
Figure 15:
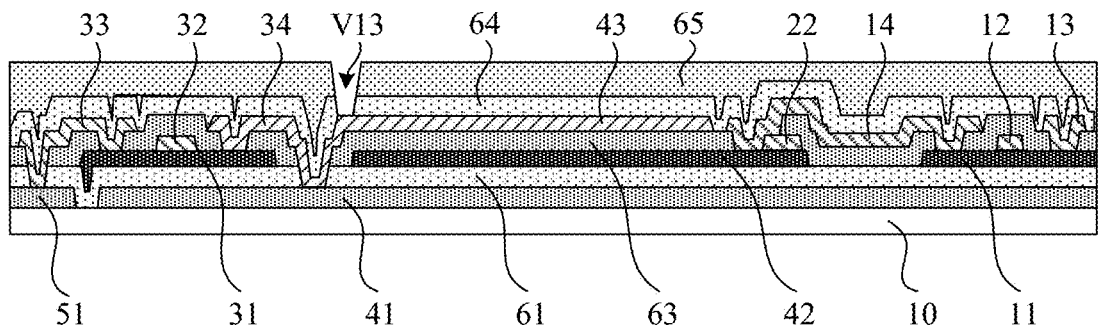
FIG. 15 is a sectional view taken along a direction A-A in FIG. 14.

(6) Patterns of a fourth insulating layer and a planarization layer are formed. In an exemplary implementation, forming the patterns of the fourth insulating layer and the planarization layer may include: first depositing a fourth insulating thin film on the substrate, on which the aforementioned patterns are formed, then coating a flat thin film, and etching the fourth insulating thin film through masking, exposure and development of the planarization thin film to form the pattern of the fourth insulating layer 64 overlying the aforementioned structures and the pattern of the planarization (PLN) layer 65 disposed on the fourth insulating layer 64. Patterns of via holes are provided in the fourth insulating layer 64 and the planarization layer 65, and the patterns of via holes at least include: a thirteenth via hole V13 located in a position where the third polar plate 43 in each sub-pixel in the display area 100 is located, as shown in FIGS. 14 and 15. FIG. 15 is a sectional view taken along a direction A-A in FIG. 14. In an exemplary implementation, the thirteenth via holes V13 in the first sub-pixel P1 and the fourth sub-pixel P4 are located in the position where the gap 44 between the second polar plates 42 and the third active layers 31 is located, the thirteenth via holes V13 in the second sub-pixel P2 and the third sub-pixel P3 are located in the position where the opening 45 in the second polar plate 42 is located, and the fourth insulating layer 64 and the planarization layer 65 in the thirteenth via holes V13 are etched away to expose the surface of the third polar plate 43. After this patterning process, the transparent area 200 includes the first insulating layer 61, the third insulating layer 63, the fourth insulating layer 64 and the planarization layer 65 stacked on the substrate 10.

Figure 16:
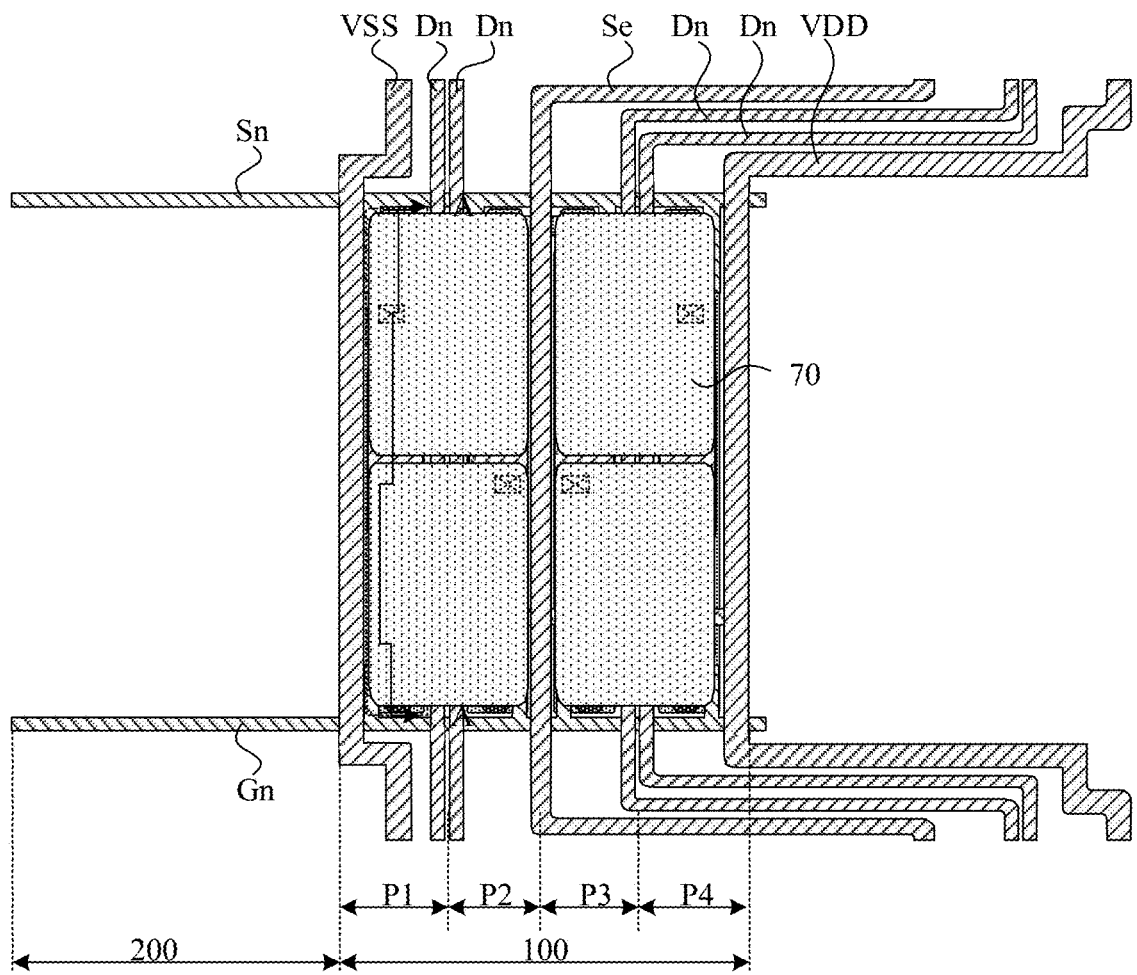
FIG. 16 is a schematic diagram that a pattern of a transparent conducting layer is formed in accordance with an exemplary embodiment of the present disclosure.
Figure 17:
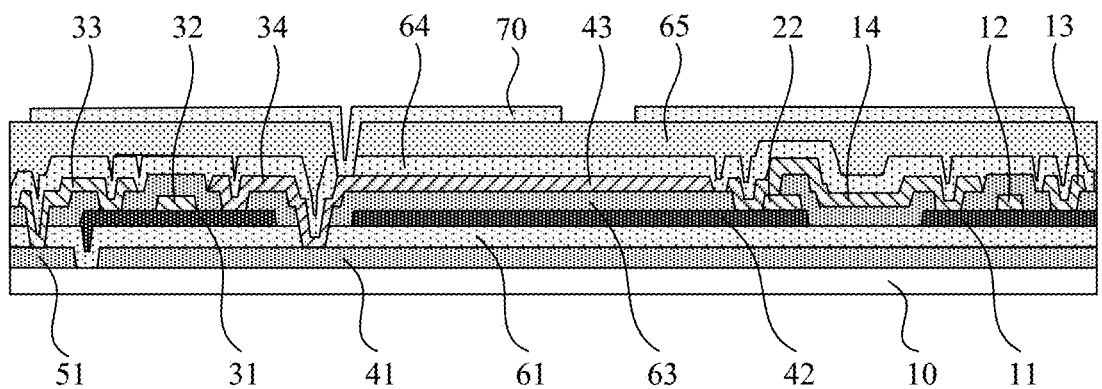
FIG. 17 is a sectional view taken along a direction A-A in FIG. 16.

(7) Pattern of a transparent conducting layer is formed. In an exemplary implementation, forming the pattern of the transparent conducting layer may include: depositing a transparent conducting thin film on the substrate, on which the aforementioned patterns are formed, and patterning the transparent conducting thin film through the patterning process to form the pattern of the transparent conducting layer on the planarization layer 65. The transparent conducting layer at least includes an anode 70, which is formed in the display area 100, and is connected to the third polar plate 43 in each sub-pixel through the thirteenth via hole V13, as shown in FIGS. 16 and 17. FIG. 17 is a sectional view taken along a direction A-A in FIG. 16. The drain electrode of the second transistor T2, the drain electrode of the third transistor T3 and the third polar plate 43 in each sub-pixel are connected to each other to form an integrated structure, such that the anode 70 is connected to the drain electrode of the second transistor T2 in each sub-pixel. In an exemplary implementation, the four anodes 70 may form a red light emitting unit, a green light emitting unit, a blue light emitting unit and a white light emitting unit. In an exemplary implementation, the four anodes 70 in the display area 100 may be rectangular, and the four anodes 70 are arranged in a shape of a square. The upper left anode 70 is connected to the third polar plate 43 of the first sub-pixel P1 through the thirteenth via hole V13 of the first sub-pixel P1, the upper right anode 70 is connected to the third polar plate 43 of the fourth sub-pixel P4 through the thirteenth via hole V13 of the fourth sub-pixel P4, the lower left anode 70 is connected to the third polar plate 43 of the second sub-pixel P2 through the thirteenth via hole V13 of the second sub-pixel P2, and the lower right anode 70 is connected to the third polar plate 43 of the third sub-pixel P3 through the thirteenth via hole V13 of the third sub-pixel P3. In some possible implementations, the four anodes 70 in the display area 100 may be strip-shaped, and the four anodes 70 are arranged in parallel, each anode 70 corresponding to the position where the sub-pixel is located. In some possible implementations, the arrangement of the anodes 70 in the display area 100 may be adjusted according to actual needs, which is not specifically limited herein in the present disclosure. After this patterning process, the film layer structure of the transparent area 200 has not changed.

Figure 18:
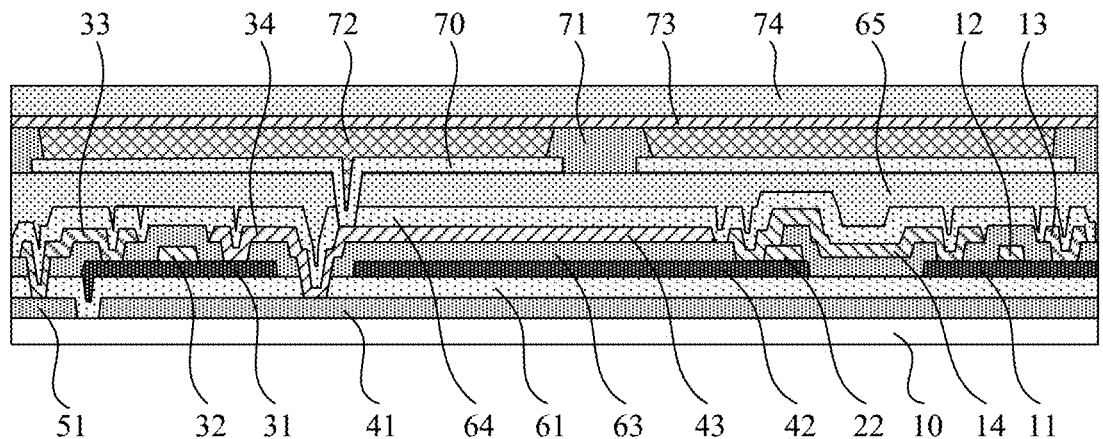
FIG. 18 is a schematic diagram that patterns of an organic light emitting layer, a cathode and an encapsulation layer are formed in accordance with an exemplary embodiment of the present disclosure.

(8) Patterns of a pixel define layer, an organic light emitting layer, a cathode and an encapsulation layer are formed. In an exemplary implementation, forming the patterns of the pixel define layer, the organic light emitting layer, the cathode and the encapsulation layer may include: coating a pixel define thin film on the substrate, on which the aforementioned patterns are formed, and forming the patterns of the pixel define layer 71 through masking, exposure and development processes. The pixel define layer 71 is formed in each sub-pixel in the display area 100, and a pixel opening exposing the anode 70 is formed in the pixel define layer 71 in each sub-pixel. Then, an organic light emitting layer 72 is formed in the previously formed pixel opening, and the organic light emitting layer 72 is connected to the anode 70. Then, a cathode thin film is deposited and patterned though the patterning processes to form the pattern of the cathode 73. The cathode 73 is connected to the organic light emitting layer 72 and the second power line respectively. Then, the encapsulation layer 74 is formed on the cathode 73. The encapsulation layer 74 may include a stacked structure of inorganic materials/organic materials/ inorganic materials, as shown in FIG. 18. In some possible implementations, the cathode 73 may be connected to the second power line VSS in many manners, such as laser drilling.

Referring to FIGS. 3-18, in each sub-pixel, the first active layer 11, the first gate electrode 12, the first source electrode 13 and the first drain electrode 14 form the first transistor T1, the second active layer 21, the second gate electrode 22, the second source electrode 23 and the second drain electrode 24 form the second transistor T2, the third active layer 31, the third gate electrode 32, the third source electrode 33 and the third drain electrode 34 form the third transistor T3, the first polar plate 41 and the second polar plate 42 form the first storage capacitor, and the second polar plate 42 and the third polar plate 43 form the second storage capacitor. The first storage capacitor and the second storage capacitor form a parallel structure to implement the storage of the potential of the second gate electrode 22 of the sub-pixel where the first storage capacitor and the second storage capacitor are located. The first transistors T1, the second transistors T2, the third transistors T3, the first storage capacitors and the second storage capacitors in the first sub-pixel P1 and the fourth sub-pixel P4 are mirror symmetric with respect to the compensating line Se, and the first transistors T1, the second transistors T2, the third transistors T3, the first storage capacitors and the second storage capacitors in the second sub-pixel P2 and the third sub-pixel P3 are mirror symmetric with respect to the compensating line Se.

In each sub-pixel, the first gate electrode 12 and the first scanning line Gn are connected to each other to form an integrated structure, the first source electrode 13 and the data lines Dn are connected to each other to form an integrated structure, and the first drain electrode 14 is connected to the second gate electrode 22 of the sub-pixel where the first drain electrode 14 is located. The second gate electrode 22 is connected to the first drain electrode 14 of the sub-pixel where the second gate electrode 22 is located, the second source electrode 23 is connected to the first power line VDD through the power connecting line 52, and the second drain electrode 24 is connected to the anode 70 of the sub-pixel where the second drain electrode 24 is located. The third gate electrode 32 and the second scanning line Sn are connected to each other to form an integrated structure, the third source electrode 33 is connected to the compensating line Se through the compensation connecting line 51, and the third drain electrode 34 is connected to the second drain electrode 24 of the sub-pixel where the third drain electrode 34 is located. The first polar plate 41 is connected to the second drain electrode 24 and the third drain electrode 34 of the sub-pixel where the first polar plate 41 is located, the second polar plate 42 is connected to the second gate electrode 22 and the first drain electrode 14 of the sub-pixel where the second polar plate 42 is located, and the third polar plate 43, the second drain electrode 24 and the third drain electrode 34 are connected to each other to form an integrated structure. The anode 70 is connected to the second drain electrode 24 of the sub-pixel where the anode 70 is located, so that the organic light emitting layer 72 between the anode 70 and the cathode 73 emits light of corresponding brightness in response to the current of the second drain electrode 24 of the sub-pixel where the organic light emitting layer 72 is located.

In some exemplary implementations, the first metal layer, the second metal layer, and the third metal layer may be made of metal materials, such as any one or more of silver (Ag), copper (Cu), aluminum (Al) and molybdenum (Mo), or alloy materials of the aforementioned metals, such as aluminum neodymium alloy (AlNd) or molybdenum niobium alloy (MoNb), and may be a single-layer structure, or a multi-layer composite structure, such as Mo/Cu/Mo, etc. The first insulating layer, the second insulating layer, the third insulating layer and the fourth insulating layer may be made of any one or more of silicon oxide (SiOx), silicon nitride (SiNx) and silicon oxynitride (SiON), and may be a single layer, multiple layers, or a composite layer. The first insulating layer is referred to as a buffer layer for improving the water and oxygen resistance of the substrate, the second insulating layer is referred to as a gate insulating (GI) layer, the third insulating layer is referred to as an interlayer insulating (ILD) layer, and the fourth insulating layer is referred to as a passivation (PVX) layer. The thickness of the second insulating layer may be smaller than the thickness of the third insulating layer, and the thickness of the first insulating layer may be smaller than the sum of the thicknesses of the second insulating layer and the thicknesses of the third insulating layer, so as to increase the capacities of the storage capacitors under the premise of ensuring the insulating effect. The planarization layer may be made of an organic material, the transparent conducting thin film may be made of indium tin oxide (ITO) or indium zinc oxide (IZO), and the pixel define layer may be made of polyimide, acrylic or polyethylene terephthalate. The cathode may be made of any one or more of Magnesium (Mg), Argentum (Ag), Aluminum (Al), Copper (Cu), and Lithium (Li), or an alloy of any one or more of the abovementioned metals.

In some possible implementations, the thickness of the first insulating layer may be from 3000 angstroms to 5000 angstroms, the thickness of the second insulating layer may be from 1000 angstroms to 2000 angstroms, the thickness of the third insulating layer may be from 4500 angstroms to 7000 angstroms, and the thickness of the fourth insulating layer may be from 3000 angstroms to 5000 angstroms. The thickness of the first metal layer may be from 80 angstroms to 1200 angstroms, the thickness of the second metal layer may be from 3000 angstroms to 5000 angstroms, and the thickness of the third metal layer may be from 3000 angstroms to 9000 angstroms.

In some possible implementations, the metal oxide layer may be made of oxides containing indium and tin, oxides containing tungsten and indium, oxides containing tungsten, indium and zinc, oxides containing titanium and indium, oxides containing titanium, indium and tin, oxides containing indium and zinc, oxides containing silicon, indium and tin, oxides containing indium, gallium and zinc, etc. The metal oxide layer may be a single layer, or double layers, or multiple layers.

As shown in FIG. 3 and FIG. 18, a display substrate in accordance with an exemplary embodiment of the present disclosure includes:
  a substrate 10;
  a first metal layer disposed on the substrate 10, the first metal layer including a first polar plate 41 and a compensation connecting line 51;
  a first insulating layer 61 overlying the first metal layer;
  a metal oxide layer disposed on the first insulating layer 61, the metal oxide layer including a first active layer 11, a second active layer 21, a third active layer 31 and a second polar plate 42, there being an overlapping area between an orthographic projection of the second polar plate 42 on the substrate 10 and an orthographic projection of the first polar plate 41 on the substrate 10, and the second polar plate 42 and the first polar plate 41 forming a first storage capacitor;
  a second insulating layer 62 and a second metal layer disposed on the second insulating layer 62, the second metal layer including: a first scanning line Gn, a second scanning line Sn, a power connecting line 52, an auxiliary power line 53, a first gate electrode 12, a second gate electrode 22 and a third gate electrode 32, the first gate electrode 12 and the first scanning line Gn forming an integrated structure, the third gate electrode 32 and the second scanning line Sn forming an integrated structure, and the second insulating layer 62 having the same pattern as the second metal layer;
  a third insulating layer 63 overlying the second metal layer, a plurality of via holes being provided in the third insulating layer 63 and including: a first via hole V1 and a second via hole V2 exposing both ends of the first active layer 11, a third via hole V3 and a fourth via hole V4 exposing both ends of the second active layer 21, a fifth via hole V5 and a sixth via hole V6 exposing both ends of the third active layer 31, a seventh via hole V7 and an eighth via hole V8 exposing the compensation connecting line 51, a ninth via hole V9 exposing both the second gate electrode 22 and the second polar plate 42, a tenth via hole V10 exposing the first polar plate 41, a plurality of eleventh via holes V11 exposing the power connecting line 52, and a plurality of twelfth via holes V12 exposing the auxiliary power line 53;

a third metal layer disposed on the third insulating layer 63, the third metal layer including a first power line VDD, a second power line VSS, a compensating line Se, data lines Dn, a first source electrode 13, a first drain electrode 14, a second source electrode 23, a second drain electrode 24, a third source electrode 33, a third drain electrode 34 and a third polar plate 43, the first power line VDD being connected to the power connecting line 52 through the eleventh via hole V11, the second power line VSS being connected to the auxiliary power line 53 through the twelfth via hole V12, the compensating line Se being connected to the compensation connecting line 51 through the seventh via hole V7, the first source electrode 13 and the data lines Dn forming an integrated structure, the second source electrode 23 being connected to the power connecting line 52 through the third via hole V3, the third source electrode 33 being connected to the compensation connecting line 51 through the eighth via hole V8, the first drain electrode 14 being connected to both the second gate electrode 22 and the second polar plate 42 through the ninth via hole V9, the second drain electrode 24, the third drain electrode 34 and the third polar plate 43 being connected to each other to form an integrated structure, the third polar plate 43 being connected to the first polar plate 41 through the tenth via hole V10, there being an overlapping area between an orthographic projection of the third polar plate 43 on the substrate 10 and the orthographic projection of the second polar plate 42 on the substrate 10, and the second polar plate 42 and the third polar plate 43 forming a second storage capacitor; within a sub-pixel row, the first power line VDD, the second power line VSS, the compensating line Se and the data lines Dn being vertical straight line segments parallel to each other; between adjacent sub-pixel rows, the first power line VDD, the second power line VSS, the compensating line Se and the data lines Dn being horizontal fold line segments, and the vertical straight line segments and horizontal fold line segments being connected to each other to form an integrated structure;

a fourth insulating layer 64 and a planarization layer 65 overlying the third metal layer, a thirteen via hole V13 exposing the third polar plate 43 being provided in the fourth insulating layer 64 and the planarization layer 65;

a transparent conducting layer disposed on the planarization layer 65, the transparent conducting layer including an anode 70 which is connected to the third polar plate 43 through the thirteenth via V13;

a pixel define layer 71 disposed on the planarization layer 65, the pixel define layer 71 defining a pixel opening exposing the anode 70 in each sub-pixel;

an organic light emitting layer 72 disposed in an opening area, the organic light emitting layer 72 being connected to the anode 70;

a cathode 73 connected to the organic light emitting layer 72; and an encapsulation layer 74 overlying the aforementioned structures.

The structure shown in the present disclosure and the manufacturing process thereof are merely an exemplary description. In an exemplary implementation, the corresponding structures may be altered and the patterning processes may be added or reduced according to actual needs. For example, the display area may include 3 sub-pixels. As another example, the pixel driving circuit may be 5T1C or 7T1C. As a further example, other electrodes or leads may also be provided in the film layer structure, which is not specifically limited herein in the present disclosure.

It can be seen from the above-described structure and manufacturing process of the display substrate that in the display substrate in accordance with the present disclosure, the transparent areas of the display substrate are staggered to form a mosaic-like transparent area, and when light passes through the mosaic-like transparent area, since positions generating diffraction fringes are different and directions of the generated diffraction fringes are different, the diffraction fringes generated by the light will not spread towards one direction but towards multiple directions, thus greatly weakening the diffraction effect, avoiding blurring of the objects behind the screen and improving the transparent display effect. The metal oxide material is used as the second polar plate to form storage capacitors with the first polar plate in the first metal layer and the third polar plate in the third metal layer respectively. The first polar plate and the third polar plate have the same potential, while the second polar plate has a potential different from the first electrode plate and the third polar plate. Therefore, the first polar plate and the second polar plate form the first storage capacitor, the second polar plate and the third polar plate form the second storage capacitor, and the first storage capacitor and the second storage capacitor form a storage capacitor with a parallel structure, effectively increasing the capacities of the storage capacitors and ensuring the driving performance. Because the display substrate includes a transparent electrode layer, and a third storage capacitor is formed between the transparent electrode layer and the second polar plate, three storage capacitors connected in parallel are actually formed in the present disclosure. Because the second polar plate in the present disclosure and the active layer are disposed on the same layer and located between the first metal layer and the third metal layer, the second polar plate is separated from the first polar plate by only the first insulating layer, the second polar plate is separated from the third polar plate by only the third insulating layer, the distance between the second polar plate and the first polar plate is close, and the distance between the second polar plate and the third polar plate is also close, and the area of the first polar plate as the shielding layer is large, so that the required capacities of the storage capacitors can be ensured, thereby simplifying the structural layout of the display area, reducing the occupied space of each sub-pixel, being beneficial to implementation of high resolution display, improving the area ratio of the transparent area and improving the quality of transparent display. The manufacturing process according to the present disclosure can be implemented using the existing mature manufacturing equipment, and improvements to the existing process are small, such that it can be well compatible with the existing manufacturing process, be simple to implement, and be easy to practice, thereby achieving high production efficiency, low production cost and high yield rate.

Figure 19:
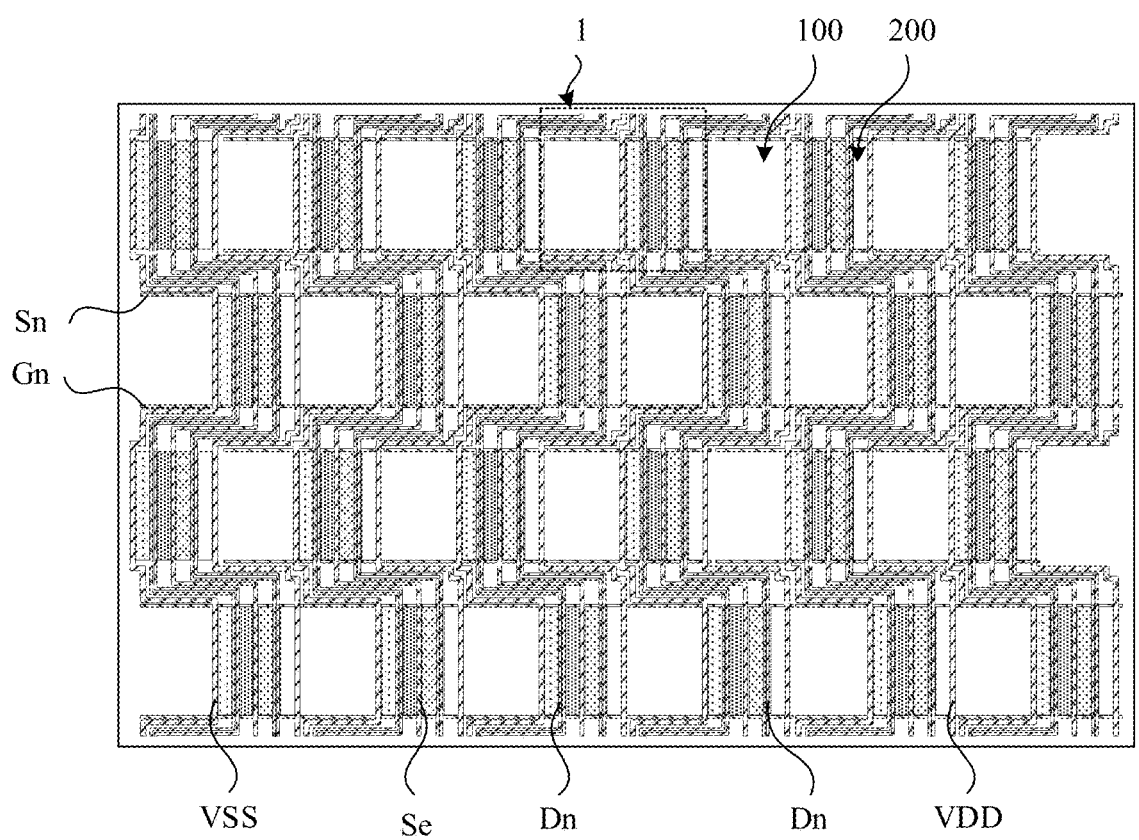
FIG. 19 is a schematic plan view of a display substrate in accordance with an exemplary embodiment of the present disclosure.

FIG. 19 is a schematic plan view of a display substrate in accordance with an exemplary embodiment of the present disclosure. As shown in FIG. 19, the display substrate of the present disclosure includes a plurality of display units 1 arranged regularly, wherein each display unit 1 includes a display area 100 and a transparent area 200, the transparent area 200 is disposed at one side of the display area 100, the display area 100 is configured to implement image display, and the transparent area 200 is configured to implement light transmission in order to implement transparent display. The display substrate includes a plurality of horizontally arranged first scanning lines Gn and second scanning lines Sn, and a plurality of vertically extending first power lines VDD and second power lines VSS. A sub-pixel row is defined between the first scanning lines Gn and the second scanning lines Sn, four sub-pixel columns are defined between the first power lines VDD and the second power lines VSS, and four sub-pixels, in which pixel driving circuits are provided, are arranged in parallel. The display substrate further includes a plurality of compensating lines Se and data lines Dn extending in the vertical direction. The compensating line Se is arranged between the first power line VDD and the second power line VSS, two data lines Dn are arranged between the second power line VSS and the compensating line Se, and the other two data lines Dn are arranged between the first power line VDD and the compensating line Se. The four sub-pixels in one display area include: a first sub-pixel defined by the second power line VSS and the data lines Dn, a second sub-pixel defined by the data lines Dn and the compensating line Se, a third sub-pixel defined by the compensating line Se and the data lines Dn, and a fourth sub-pixel defined by the data lines Dn and the first power line VDD. In an exemplary implementation, the first power lines VDD, the second power lines VSS, the compensating lines Se and the data lines Dn extending in the vertical direction include vertical straight line segments and horizontal fold line segments, wherein the vertical straight line segments are arranged within the sub-pixel rows and the horizontal fold line segments are arranged between the adjacent sub-pixel rows, so that the transparent areas 200 in odd display rows and the transparent areas 200 in even display rows are staggered to form a mosaic-like transparent area. In some possible implementations, vertex angles of the transparent areas in two adjacent display rows can be set to be opposite to each other to increase the transparent aperture ratio. In the present disclosure, the transparent areas of the display substrate are set to be mosaic-like to decrease the diffraction effect of transparent display effectively. when light passes through the mosaic-like transparent area, since positions generating diffraction fringes are different and directions of the generated diffraction fringes are different, the diffraction fringes generated by the light will not spread towards one direction but towards multiple directions, thus greatly weakening the diffraction effect, avoiding blurring of the objects behind the screen and improving the transparent display effect.

Figure 20:
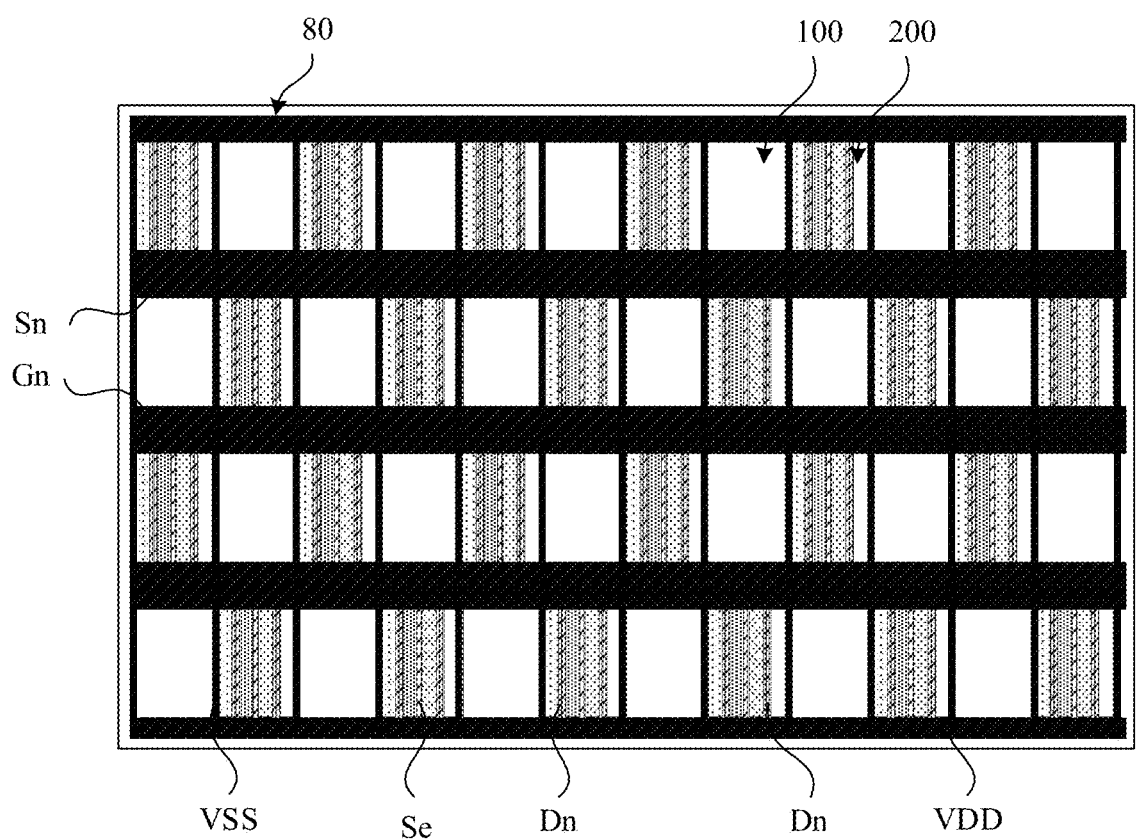
FIG. 20 is a schematic plan view of another structure of a display substrate in accordance with an exemplary embodiment of the present disclosure.

FIG. 20 is a schematic plan view of another structure of a display substrate in accordance with an exemplary embodiment of the present disclosure. In an exemplary implementation, the display substrate further includes shielding strips 80, which are arranged at an edge of the display area 100, or at an edge of the transparent area 200, or at edges of the display area 100 and the transparent area 200, and are configured to decrease the light reflection phenomenon and diffraction effect of the display area. As shown in FIG. 20, the shielding strips 80 in the horizontal direction are arranged between the first scanning lines Gn and the second scanning lines Sn in the adjacent display rows, and an orthographic projection of the shielding strips 80 on the substrate includes orthographic projections of the first scanning line Gn, the second scanning line Sn and the horizontal fold line segment on the substrate. The shielding strip 80 in the vertical direction is arranged in a position where the first power line VDD and the second power line VSS are located, and an orthographic projection of the shielding strip 80 on the substrate includes orthographic projections of the first power line VDD and the second power line VSS on the substrate.

Because a plurality of signal lines are provided in the display area 100 and the transparent area 200 and the signal lines are made of metal materials, when external light is incident onto the display area 100 and the transparent area 200, not only does metal light reflection occur in the light incident on these metal signal lines, but also complicated diffraction fringes occur in light past these metal signal lines, thereby resulting in serious light reflection phenomenon and diffraction effect and decreasing the transparent display effect. In addition, the light reflection phenomenon and diffraction effect will further decrease the imaging quality of a camera in a transparent display device, such that distortion problems, such as blurring, ghosting and colored edges, occur in images captured by the camera. In the display substrate in accordance with the present disclosure, the shielding strips 80 are arranged at the edges of the display area 100 and the transparent area 200, such that the shielding strips 80 are located on a light path along which the light is incident on the signal lines, and the metal signal lines located at the edges of the display area 100 and the transparent area 200 are shielded by the shielding strips 80, to reduce the light incident on or past the metal signal lines, thereby not only decreasing the reflection phenomenon of the signal lines effectively, but also decreasing the diffraction effect of the signal lines effectively, improving the transparent display effect, and improving the imaging quality of the camera.

In some possible implementations, other structures of the display substrate are similar to the corresponding structures described in the previous embodiments, and the shielding strip 80 may adopt a black matrix (BM for short) or at least two color filter layers stacked, for example, a red color filter layer and a blue color filter layer.

The present disclosure further provides a method for manufacturing a display substrate, wherein the display substrate includes a plurality of display units, each of the display units includes a display area and a transparent area, and the display area includes a plurality of sub-pixels. In an exemplary implementation, the method includes:

S1. forming a first metal layer, a metal oxide layer and a second metal layer on a substrate, wherein the first metal layer includes a first polar plate; the metal oxide layer includes a second polar plate, and there is an overlapping area between an orthographic projection of the second polar plate on the substrate and an orthographic projection of the first polar plate on the substrate to form a first storage capacitor; the second metal layer includes a first scanning line and a second scanning line which extend in a horizontal direction and define a display row; and S2. forming a third metal layer, wherein the third metal layer includes a third polar plate, and a first power line, a second power line, a compensating line and data lines which extend in a vertical direction and define the plurality of sub-pixels; there is an overlapping area between an orthographic projection of the third polar plate on the substrate and an orthographic projection of the second polar plate on the substrate to form a second storage capacitor, and the third polar plate is connected to the first polar plate through a via hole; the first power line, the second power line, the compensating line and the data lines all include vertical straight line segments and horizontal fold line segments, the vertical straight line segments are arranged between the first scanning line and the second scanning line in the display row, and the horizontal fold line segments are arranged between the first scanning lines and the second scanning lines in its adjacent display rows, such that the display areas in the adjacent display rows are staggered, and the transparent areas in the adjacent display rows are staggered.

In an exemplary implementation, step S1 of forming the first metal layer, the metal oxide layer and the second metal layer on the substrate successively may include:

S11. forming the first metal layer including the first polar plate and a compensation connecting line on the substrate;

S12. forming a first insulating layer overlying the first metal layer, and forming the metal oxide layer including the second polar plate on the first insulating layer; and S13. forming a second insulating layer and the second metal layer disposed on the second insulating layer, wherein pattern of the second insulating layer is the same as pattern of the second metal layer, and the second metal layer includes the first scanning line, the second scanning line and a power connecting line.

In an exemplary implementation, step S2 of forming the third metal layer includes:

S21. forming a third insulating layer overlying the second metal layer, wherein a plurality of via holes are formed in the third insulating layer, and the plurality of via holes includes a seventh via hole exposing the compensation connecting line, a tenth via hole exposing the first polar plate and an eleventh via hole exposing the power connecting line; and S22. forming the third metal layer on the third insulating layer, wherein the third metal layer includes the third polar plate, the first power line, the second power line, the compensating line, the data lines; there is the overlapping area between the orthographic projection of the third polar plate on the substrate and the orthographic projection of the second polar plate on the substrate to form the second storage capacitor, and the third polar plate is connected to the first polar plate through the tenth via hole; the compensating line is connected to the compensating line through the seventh via hole, and the first power line is connected to the power connecting line through the eleventh via hole.

In an exemplary implementation, the method further includes:

S31. forming a fourth insulating layer and a planarization layer overlying the third metal layer;

S32. forming a light emitting element and an encapsulation layer on the planarization layer, wherein an anode of the light emitting element is connected to the third polar plate, and an cathode of the light emitting element is connected to the second power line; and S33. forming a shielding strip on the encapsulation layer, wherein an orthographic projection of the shielding strip on the substrate contains orthographic projections of the first scanning line, the second scanning line, the first power line and the second power line on the substrate.

The process of manufacturing the display substrate has been described in detail in the previous embodiments and will not be repeated herein.

In the method of manufacturing the display substrate in accordance with the present disclosure, the transparent areas of the display substrate are staggered to form a mosaic-like transparent area, and when light passes through the mosaic-like transparent area, since positions generating diffraction fringes are different and directions of the generated diffraction fringes are different, the diffraction fringes generated by the light will not spread towards one direction but towards multiple directions, thus greatly weakening the diffraction effect, avoiding blurring of the objects behind the screen and improving the transparent display effect. The second polar plate is made of a metal oxide material, the first polar plate and the second polar plate form the first storage capacitor, the second polar plate and the third polar plate form the second storage capacitor, and the first storage capacitor and the second storage capacitor form a storage capacitor with a parallel structure, thereby increasing the capacities of the storage capacitors effectively, simplifying the structural layout of the display area, reducing the occupied space of each sub-pixel, being beneficial to implementation of high resolution display, improving the area ratio of the transparent area and improving the quality of transparent display. The manufacturing process according to the present disclosure can be implemented using the existing mature manufacturing equipment, and improvements to the existing process are small, such that it can be well compatible with the existing manufacturing process, be simple to implement, and be easy to practice, thereby achieving high production efficiency, low production cost and high yield rate.

The present disclosure further provides a display device which includes the display substrate in accordance with the aforementioned embodiments. The display device may be any product or component with a display function, such as a mobile phone, a tablet computer, a television, a display, a notebook computer, a digital photo frame, or a navigator.

The drawings of the present disclosure are only related to the structures involved in the present disclosure, and the other structures may be made with reference to usual designs. The embodiments of the present disclosure, i.e., features in the embodiments, can be combined with each other if there are no conflicts, to obtain new embodiments.

Those of ordinary skill in the art should understand that modifications or equivalent substitutions to the technical schemes of the present disclosure, which may be made without departing from the spirit and scope of the technical schemes of the present disclosure, shall all fall within the scope of the claims of the present disclosure.

The invention claimed is:

1. A display substrate, comprising:
a plurality of display units, wherein each of the display units comprises a display area and a transparent area, and the display area comprises a plurality of sub-pixels; in a direction perpendicular to the display substrate, each of the sub-pixels comprises a first metal layer, a metal oxide layer, a second metal layer and a third metal layer which are disposed on a substrate, the first metal layer comprises a first polar plate, the metal oxide layer comprises a second polar plate, the second metal layer comprises a first scanning line and a second scanning line which extend in a horizontal direction and define a display row, and the third metal layer comprises a third polar plate, and a first power line, a second power line, a compensating line and data lines which extend in a vertical direction and define the plurality of sub-pixels; there is an overlapping area between an orthographic projection of the second polar plate on the substrate and an orthographic projection of the first polar plate on the substrate to form a first storage capacitor, there is an overlapping area between an orthographic projection of the third polar plate on the substrate and the orthographic projection of the second polar plate on the substrate to form a second storage capacitor, and the third polar plate is connected to the first polar plate through a via hole; and the first power line, the second power line, the compensating line and the data lines all comprise vertical straight line segments and horizontal fold line segments, the vertical straight line segments are arranged between the first scanning line and the second scanning line in the display row, and the horizontal fold line segments are arranged between the first scanning lines and the second scanning lines in an adjacent display rows, allowing the display areas in the adjacent display rows staggered, and the transparent areas in the adjacent display rows staggered.

2. The display substrate according to claim 1, wherein the display area comprises four sub-pixels in which pixel driving circuits are provided, the four sub-pixels comprise a first sub-pixel, a second sub-pixel, a third sub-pixel and a fourth sub-pixel which are arranged successively, and the pixel driving circuits in the four sub-pixels are arranged in parallel.

3. The display substrate according to claim 2, wherein a pixel driving circuit of the first sub-pixel and a pixel driving circuit of the fourth sub-pixel are arranged mirror-symmetrically with respect to the compensating line, and a pixel driving circuit of the second sub-pixel and a pixel driving circuit of the third sub-pixel are arranged mirror-symmetrically with respect to the compensating line.

4. The display substrate according to claim 2, wherein each pixel driving circuit comprises a first transistor, a second transistor, a third transistor and a storage capacitor, a gate electrode of the first transistor is connected to the first scanning line, a first electrode of the first transistor is connected to a data line, a second electrode of the first transistor is connected to a gate electrode of the second transistor, a first electrode of the second transistor is connected to the first power line, a second electrode of the second transistor is connected to a first electrode of an organic light emitting diode, a gate electrode of the third transistor is connected to the second scanning line, a first electrode of the third transistor is connected to the compensating line through a compensation connecting line, a second electrode of the third transistor is connected to the second electrode of the second transistor, and a second electrode of the organic light emitting diode is connected to the second power line; the first polar plate and the third polar plate are connected to the second electrode of the second transistor, and the second polar plate is connected to the gate electrode of the second transistor.

5. The display substrate according to claim 4, wherein the pixel driving circuit further comprises a power connecting line, and the first electrode of the second transistor is connected to the first power line through the power connecting line; the power connecting line is arranged on a same layer as the first scanning line and the second scanning line, and the first power line is connected to the power connecting line through a via hole, to form a double-layer trace between the gate electrode of the first transistor and the gate electrode of the third transistor.

6. The display substrate according to claim 4, wherein the pixel driving circuit further comprises an auxiliary power line which is arranged on a same layer as the first scanning line and the second scanning line, and the second power line is connected to the auxiliary power line through a via hole, to form a double-layer trace between the gate electrode of the first transistor and the gate electrode of the third transistor.

7. The display substrate according to claim 4, wherein the compensation connecting line is arranged on a same layer as the first polar plate, and the second polar plate is arranged on a same layer as an active layer of the first transistor, an active layer of the second transistor and an active layer of the third transistor.

8. The display substrate according to claim 4, wherein the organic light emitting diode comprises an anode, an organic light emitting layer and a cathode, and the anode is connected to the second electrode of the second transistor of each sub-pixel through a via hole; via holes of the first sub-pixel and the fourth sub-pixel are provided in a gap area between the second polar plate and the active layer of the third transistor, and via holes of the second sub-pixel and the third sub-pixel are provided in an opening area formed in the second polar plate.

9. The display substrate according to claim 4, wherein in a direction parallel to the first scanning line, a width of the first power line is greater than a width of the compensating line or data line, and a width of the second power line is greater than a width of the compensating line or data line.

10. The display substrate according to claim 4, wherein the first polar plate serves as a shielding layer, a shape of the first polar plate comprises a strip-shaped rectangle, and in a direction parallel to the compensating line, a length of the first polar plate is greater than a distance between the gate electrode of the first transistor and the gate electrode of the third transistor.

11. The display substrate according to claim 1, wherein each of the horizontal fold line segments at least comprises a first vertical line, a first horizontal line and a second vertical line, a first end of the first vertical line is connected to the first power line, the second power line, the compensating line or a data line in the display row, a first end of the second vertical line is connected to the first power line, the second power line, the compensating line or the data line in the adjacent display row, and both ends of the first horizontal line are respectively connected to second ends of the first vertical line and the second vertical line.

12. The display substrate according to claim 11, wherein an extension direction of the first horizontal line at one side of the display row is the same as the extension direction of the first horizontal line at the other side of the display row, or the extension direction of the first horizontal line at one side of the display row is opposite to the extension direction of the first horizontal line at the other side of the display row.

13. The display substrate according to claim 11, wherein quantities of corners of the horizontal fold line segments of the first power line and the second power line are greater than quantities of corners of the horizontal fold line segments of the compensating line and the data lines.

14. The display substrate according to claim 1, wherein the display areas in odd display rows are aligned, the transparent areas in the odd display rows are aligned, the display areas in even display rows are aligned and the transparent areas in the even display rows are aligned; or the display areas in the odd display rows are aligned with the transparent areas in the even display rows; or i-th sub-pixels of the display areas in the odd display rows are aligned with first sub-pixels of the display areas in the even display rows; or the i-th sub-pixels of the display areas in the even display rows are aligned with the first sub-pixels of the display areas in the odd display rows; i=2, 3 or 4.

15. The display substrate according to claim 1, wherein vertical straight line segments of first power lines in odd display rows are aligned with vertical straight line segments of second power lines in even display rows; or the vertical straight line segments of the second power lines in the odd display rows are aligned with the vertical straight line segments of the first power lines in the even display rows; or the vertical straight line segments of the first power lines in the odd display rows are aligned with the vertical straight line segments of compensating lines in the even display rows; or the vertical straight line segments of the second power lines in the odd display rows are aligned with the vertical straight line segments of the compensating lines in the even display rows; or the vertical straight line segments of the first power lines in the odd display rows are aligned with the vertical straight line segments of the data lines in the even display rows; or the vertical straight line segments of the second power lines in the odd display rows are aligned with the vertical straight line segments of the data lines in the even display rows.

16. The display substrate according to claim 1, wherein the display substrate further comprises a shielding strip, and an orthographic projection of the shielding strip on the substrate contains orthographic projections of the first scanning line, the second scanning line, the first power line and the second power line on the substrate.

17. A display device, comprising the display substrate according to claim 1.

18. A method for manufacturing a display substrate, wherein the display substrate comprises a plurality of display units, each of the display units comprises a display area and a transparent area, and the display area comprises a plurality of sub-pixels; the method comprises:
   forming a first metal layer, a metal oxide layer and a second metal layer on a substrate, wherein the first metal layer comprises a first polar plate; the metal oxide layer comprises a second polar plate, and there is an overlapping area between an orthographic projection of the second polar plate on the substrate and an orthographic projection of the first polar plate on the substrate to form a first storage capacitor; the second metal layer comprises a first scanning line and a second scanning line which extend in a horizontal direction and define a display row; and
   forming a third metal layer, wherein the third metal layer comprises a third polar plate, and a first power line, a second power line, a compensating line and data lines which extend in a vertical direction and define the plurality of sub-pixels; there is an overlapping area between an orthographic projection of the third polar plate on the substrate and an orthographic projection of the second polar plate on the substrate to form a second storage capacitor, and the third polar plate is connected to the first polar plate through a via hole; the first power line, the second power line, the compensating line and the data lines all comprise vertical straight line segments and horizontal fold line segments, the vertical straight line segments are arranged between the first scanning line and the second scanning line in the display row, and the horizontal fold line segments are arranged between first scanning lines and second scanning lines in an adjacent display rows, allowing the display areas in the adjacent display rows staggered, and the transparent areas in the adjacent display rows staggered.

19. The method according to claim 18, wherein forming the first metal layer, the metal oxide layer and the second metal layer on the substrate successively comprises:
   forming the first metal layer on the substrate, wherein the first metal layer comprises the first polar plate and a compensation connecting line;
   forming a first insulating layer overlying the first metal layer, and forming the metal oxide layer on the first insulating layer, wherein the metal oxide layer comprises the second polar plate; and
   forming a second insulating layer and the second metal layer disposed on the second insulating layer, wherein a pattern of the second insulating layer is the same as a pattern of the second metal layer, and the second metal layer comprises the first scanning line, the second scanning line and a power connecting line;
   wherein forming the third metal layer comprises:
   forming a third insulating layer overlying the second metal layer, wherein a plurality of via holes are formed in the third insulating layer, and the plurality of via holes comprises a seventh via hole exposing the compensation connecting line, a tenth via hole exposing the first polar plate and an eleventh via hole exposing the power connecting line; and
   forming the third metal layer on the third insulating layer, wherein the third metal layer comprises the third polar plate, the first power line, the second power line, the compensating line, the data lines; and the third polar plate is connected to the first polar plate through the tenth via hole; the compensating line is connected to the compensation connecting line through the seventh via hole, and the first power line is connected to the power connecting line through the eleventh via hole.

20. The method according to claim 18, further comprising:
   forming a fourth insulating layer and a planarization layer overlying the third metal layer;
   forming a light emitting element and an encapsulation layer on the planarization layer, wherein an anode of the light emitting element is connected to the third polar plate, and an cathode of the light emitting element is connected to the second power line; and
   forming a shielding strip on the encapsulation layer, wherein an orthographic projection of the shielding strip on the substrate contains orthographic projections of the first scanning line, the second scanning line, the first power line and the second power line on the substrate.

* * * * *